(12) United States Patent
Choi et al.

(10) Patent No.: US 12,492,462 B2
(45) Date of Patent: Dec. 9, 2025

(54) METHOD OF MAKING A DISPLAY APPARATUS USING A SELECTIVE MASK STRUCTURE

(71) Applicant: SAMSUNG DISPLAY CO., LTD., Yongin-si (KR)

(72) Inventors: Yunjung Choi, Yongin-si (KR); Sangyeol Kim, Yongin-si (KR); Sokwon Noh, Yongin-si (KR); Haram Yoo, Yongin-si (KR); Younghoon Jo, Yongin-si (KR); Jungmin Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/665,836

(22) Filed: May 16, 2024

(65) Prior Publication Data
US 2024/0306437 A1   Sep. 12, 2024

Related U.S. Application Data

(62) Division of application No. 16/802,159, filed on Feb. 26, 2020, now abandoned.

(30) Foreign Application Priority Data

May 10, 2019   (KR) ................. 10-2019-0055167
Feb. 10, 2020  (KR) ................. 10-2020-0015835

(51) Int. Cl.
*C23C 14/04*   (2006.01)
*H10K 59/122*  (2023.01)
(Continued)

(52) U.S. Cl.
CPC ......... *C23C 14/042* (2013.01); *H10K 59/122* (2023.02); *H10K 59/126* (2023.02); *H10K 59/873* (2023.02); *H10K 71/00* (2023.02)

(58) Field of Classification Search
CPC ............ H01L 27/3246; H01L 27/3272; H01L 51/5246; H01L 51/56; H10K 59/122;
(Continued)

(56) References Cited

U.S. PATENT DOCUMENTS 7,507,590 B2   3/2009  Konda
8,759,197 B2   6/2014  Holden
(Continued)

FOREIGN PATENT DOCUMENTS

CN    103270816 A    8/2013
CN    103682145 A    3/2014
(Continued)

OTHER PUBLICATIONS

Office Action dated Apr. 30, 2025 in corresponding CN Patent Application No. 202010381157.9, 9 pages.
(Continued)

*Primary Examiner* — Eric W Jones
(74) *Attorney, Agent, or Firm* — F. CHAU & ASSOCIATES, LLC

(57) ABSTRACT

A display apparatus includes: a substrate that includes a display area, an opening area formed in the display area, and a non-display area that surrounds at least a portion of the opening area; a pixel defining area formed on the substrate and that includes at least one opening; an intermediate layer disposed on the at least one opening; an opposite electrode that covers the intermediate layer and the pixel defining layer; and a capping layer that covers the opposite electrode. An end portion of at least one of the intermediate layer, the opposite electrode, or the capping layer is formed on the pixel defining layer and has a thickness that decreases away from the at least one opening.

18 Claims, 27 Drawing Sheets

(51) Int. Cl.
*H10K 59/126* (2023.01)
*H10K 59/80* (2023.01)
*H10K 71/00* (2023.01)

(58) Field of Classification Search
CPC .. H10K 59/126; H10K 71/00; H10K 50/8426; H10K 59/873; C23C 14/042
USPC ..................................................... 257/40, 59
See application file for complete search history.

(56) References Cited

U.S. PATENT DOCUMENTS

| | | | |
|---|---|---|---|
| 8,809,732 | B2 | 8/2014 | Sykes et al. |
| 9,076,989 | B2 | 7/2015 | Sonoda et al. |
| 9,263,708 | B2 | 2/2016 | Jang |
| 10,128,461 | B2 | 11/2018 | Kang et al. |
| 10,135,025 | B2 | 11/2018 | Kim et al. |
| 10,205,122 | B2 | 2/2019 | Choi et al. |
| 10,243,031 | B2 | 3/2019 | Lee et al. |
| 10,312,305 | B2 | 6/2019 | Kim et al. |
| 10,553,651 | B2 | 2/2020 | Yim et al. |
| 10,615,369 | B2 | 4/2020 | Choi et al. |
| 10,720,596 | B2 | 7/2020 | Cho et al. |
| 10,847,589 | B2 | 11/2020 | Xiang |
| 10,897,026 | B2 | 1/2021 | Abe |
| 11,018,327 | B2 | 5/2021 | Wang et al. |
| 11,545,626 | B2 | 1/2023 | Kim et al. |
| 2005/0079650 | A1* | 4/2005 | Mancini ................ G03F 7/094 438/105 |
| 2009/0009069 | A1 | 1/2009 | Takata |
| 2009/0309489 | A1 | 12/2009 | Takata et al. |
| 2012/0056531 | A1* | 3/2012 | Park ................ H10K 50/125 313/506 |
| 2014/0021856 | A1 | 1/2014 | Jung et al. |
| 2014/0138634 | A1 | 5/2014 | Lee et al. |
| 2016/0124557 | A1 | 5/2016 | Choi |
| 2016/0190389 | A1 | 6/2016 | Lee et al. |
| 2017/0110661 | A1 | 4/2017 | Lee |
| 2017/0117476 | A1 | 4/2017 | Kim et al. |
| 2017/0141166 | A1 | 5/2017 | Kim et al. |
| 2017/0148856 | A1 | 5/2017 | Choi et al. |
| 2017/0162111 | A1 | 6/2017 | Kang et al. |
| 2017/0162637 | A1 | 6/2017 | Choi et al. |
| 2017/0278912 | A1 | 9/2017 | Kim et al. |
| 2017/0279079 | A1 | 9/2017 | Kim et al. |
| 2017/0304951 | A1 | 10/2017 | Lee |
| 2017/0352712 | A1 | 12/2017 | Lee et al. |
| 2017/0365812 | A1* | 12/2017 | Choung ................ H10K 50/15 |
| 2018/0069070 | A1 | 3/2018 | Lee et al. |
| 2018/0198067 | A1 | 7/2018 | Kim et al. |
| 2019/0165080 | A1 | 5/2019 | Ito |
| 2019/0326553 | A1 | 10/2019 | Abe |
| 2020/0185466 | A1 | 6/2020 | Xiang |
| 2020/0357869 | A1 | 11/2020 | Choi et al. |
| 2021/0355573 | A1 | 11/2021 | Zhou |

FOREIGN PATENT DOCUMENTS

| | | |
|---|---|---|
| CN | 106450008 A | 2/2017 |
| CN | 107236927 A | 10/2017 |
| CN | 107731888 A | 2/2018 |
| CN | 107799557 A | 3/2018 |
| CN | 108321176 A | 7/2018 |
| CN | 108417737 A | 8/2018 |
| CN | 109326742 A | 2/2019 |
| CN | 109371361 A | 2/2019 |
| CN | 109390375 A | 2/2019 |
| CN | 109148525 | 2/2021 |
| EP | 3131132 | 2/2017 |
| JP | 2006-221982 A2 | 8/2006 |
| JP | 2007-258336 A2 | 10/2007 |
| JP | 2008-501531 A2 | 1/2008 |
| KR | 10-0581960 B1 | 5/2006 |
| KR | 10-0872808 B1 | 12/2008 |
| KR | 10-2015-0006563 A | 1/2015 |
| KR | 10-1712483 B1 | 2/2017 |
| KR | 10-2017-0057502 A | 5/2017 |
| KR | 10-2017-0059864 A | 5/2017 |
| KR | 10-2017-0096646 A | 8/2017 |
| KR | 10-2017-0113763 A | 10/2017 |
| KR | 10-2017-0120225 A | 10/2017 |
| KR | 10-2018-0056154 A | 5/2018 |
| KR | 10-2018-0083459 A | 7/2018 |
| KR | 10-1881256 B1 | 7/2018 |
| KR | 10-2019-0014272 A | 2/2019 |
| KR | 10-2019-0018120 A | 2/2019 |
| WO | 2019030858 A1 | 2/2019 |

OTHER PUBLICATIONS

Chinese Office Action dated Nov. 13, 2024 in corresponding CN Patent Application No. 202010381157.9, 10 pages, in Chinese.

* cited by examiner

METHOD OF MAKING A DISPLAY APPARATUS USING A SELECTIVE MASK STRUCTURE

CROSS-REFERENCE TO RELATED APPLICATION

This application is a divisional of U.S. patent application Ser. No. 16/802,159, filed on Feb. 26, 2020 in the U.S. Patent and Trademark Office, which claims priority under 35 U.S.C. § 119 from, and the benefit of, Korean Patent Application No. 10-2019-0055167, filed on May 10, 2019 in the Korean Intellectual Property Office, and Korean Patent Application No. 10-2020-0015835, filed on Feb. 10, 2020 in the Korean Intellectual Property Office, the contents of all of which are herein incorporated by reference in their entireties.

BACKGROUND

1. Technical Field

One or more embodiments are directed to an apparatus and a method, and more particularly, to a display apparatus and a method of manufacturing the display apparatus.

2. Discussion of the Related Art

Recently, display apparatuses have been used for various purposes. In addition, due to decreased thicknesses and lighter weight thereof, display apparatuses tend to be more widely used.

Due to an increase in an area of a display area in a display apparatus, an increased number of functions are being added or linked to the display apparatus.

SUMMARY

One or more embodiments include a display apparatus that includes a display panel that has a display area in which various kinds of components may be arranged, and a method of manufacturing the display apparatus.

According to one or more embodiments, a display apparatus includes: a substrate that includes a display area, an opening area in the display area, and a non-display area that surrounds at least a portion of the opening area; a pixel defining layer on the substrate and that includes at least one opening; an intermediate layer disposed in the at least one opening; an opposite electrode that covers the intermediate layer and the pixel defining layer; and a capping layer that covers the opposite electrode, where an end portion of at least one of the intermediate layer, the opposite electrode, or the capping layer is disposed on the pixel defining layer and has a thickness that decreases away from the at least one opening.

In a present embodiment, the intermediate layer includes at least one of a first functional layer or a second functional layer.

In a present embodiment, the intermediate layer, the opposite electrode, and the capping layer are sequentially stacked on the pixel defining layer.

In a present embodiment, the display apparatus further includes an encapsulation substrate disposed on and spaced above the substrate.

In a present embodiment, the display apparatus further includes a thin film encapsulation layer disposed on the capping layer.

In a present embodiment, a penetration hole is formed in the opening area.

According to one or more embodiments, a method of manufacturing a display apparatus includes: forming a pixel defining layer on a substrate, where the substrate includes an opening area and a non-display area that at least partially surrounds the opening area; forming a shielding unit that covers a portion of the pixel defining layer, the opening area and the non-display area; and forming an intermediate layer, an opposite electrode, and a capping layer on the pixel defining layer and the shielding unit.

In a present embodiment, the shielding unit includes a first shielding unit that shields the opening area; and a second shielding unit connected to the first shielding unit and spaced above an upper surface of the pixel defining layer.

In a present embodiment, the first shielding unit and the second shielding unit are respectively formed at different heights.

In a present embodiment, the shielding unit further includes an adhesion unit formed under the first shielding unit.

In a present embodiment, at least a portion of the adhesion unit is formed in the non-display area.

In a present embodiment, the method further includes removing the shielding unit from the substrate.

In a present embodiment, the method further includes forming an encapsulation substrate above and apart from the substrate and attaching the encapsulation substrate to the substrate.

In a present embodiment, the method further includes forming a thin film encapsulation layer on the pixel defining layer.

In a present embodiment, the method further includes forming a penetration hole in the substrate.

According to one or more embodiments, a method of manufacturing a display apparatus includes: forming a pixel defining layer on a substrate, where the substrate includes a display area, an opening area in the display area and a non-display area that at least partially surrounds the opening area; and attaching a shielding unit to the opening area or the non-display area that shield a portion of the pixel defining layer, the opening area and the non-display area. A portion of the shielding unit is spaced apart from the pixel defining layer, and a first portion of the shielding unit is formed at a height that differs from a height of a second portion of the shielding unit.

In a present embodiment, the method includes forming an intermediate layer, an opposite electrode, and a capping layer on the pixel defining layer and the shielding unit.

In a present embodiment, the shielding unit is attached to the display area and/or the non-display area.

In a present embodiment, the shielding unit is attached to the display area or the non-display area at a plurality of positions in the display area or the non-display area, where the plurality of positions are spaced apart from each other.

In a present embodiment, the shielding unit is attached to the non-display area and covers the opening area.

In a present embodiment, the method further includes removing the shielding unit from the substrate.

In a present embodiment, the method further includes forming an encapsulation substrate over the substrate that is spaced apart from the substrate and combining the encapsulation substrate with the substrate.

In a present embodiment, the method further includes forming a thin film encapsulation layer on the pixel defining layer.

In a present embodiment, the method further includes forming a penetration hole in the substrate.

Such general and particular aspects may be embodied by using a system, a method, a computer program, or a combination of the system, the method, and the computer program.

DETAILED DESCRIPTION

Figure 1:
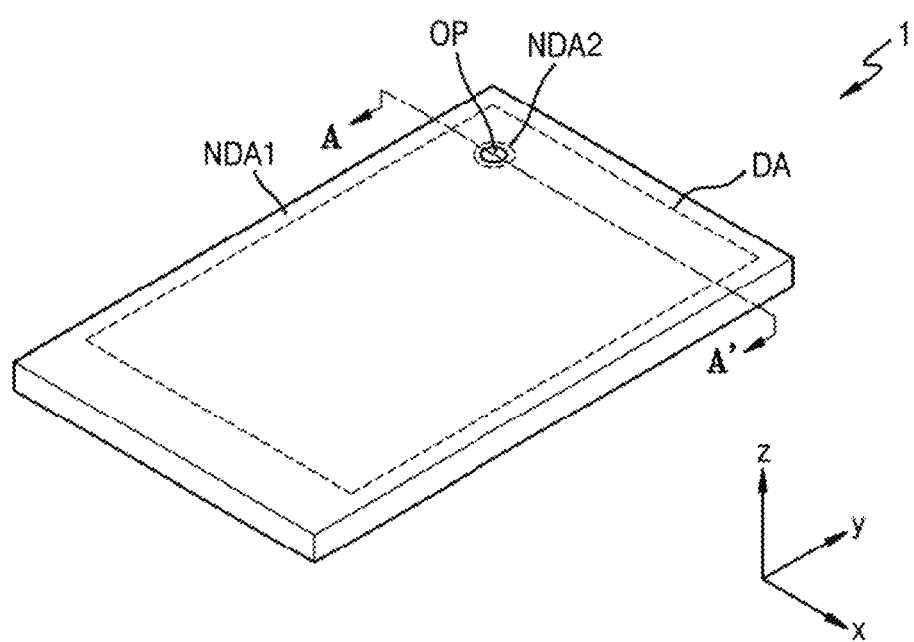
FIG. 1 is a perspective view of a display apparatus according to an embodiment.

Reference will now be made in detail to embodiments, examples of which are illustrated in the accompanying drawings, wherein like reference symbols may refer to like elements throughout. In this regard, the present embodiments may have different forms and should not be construed as being limited to the descriptions set forth herein.

Hereinafter, embodiments will be described in detail with reference to the accompanying drawings. Throughout the descriptions, same symbol references may be given to same or corresponding components, and repeated descriptions thereof will be omitted.

It will be understood that when a layer, area, or component is referred to as being "on" another layer, area, or component, it may be directly or indirectly on the other layer, area, or component.

Sizes of components in the drawings may be exaggerated for convenience of explanation.

FIG. 1 is a perspective view of a display apparatus 1 according to an embodiment.

Referring to FIG. 1, according to an embodiment, the display apparatus 1 includes an opening area OP and a display area DA that at least partially surrounds the opening area OP. The display apparatus 1 displays an image by using light that is emitted from a plurality of pixels arranged in the display area DA. In FIG. 1, one opening area OP is provided in the display area DA, and the opening area OP is entirely surrounded by the display area DA. The opening area OP accommodates a component to be described below with reference to FIG. 2.

According to an embodiment, a second non-display area NDA2 is provided between the opening area OP and the display area DA, and the display area DA is surrounded by a first non-display area NDA1. The second non-display area NDA2 and the first non-display area NDA1 are non-display areas in which no pixels are disposed. The second non-display area NDA2 is entirely surrounded by the display area DA, and the display area DA is entirely surrounded by the first non-display area NDA1.

Hereinafter, an organic light-emitting display is described as an example of the display apparatus 1 according to an embodiment, but embodiments are not limited thereto. In other embodiments, the display apparatus 1 may be another type of display apparatus, such as a quantum dot light-emitting display.

FIG. 1 illustrates one opening area OP that is approximately circular, but embodiments are not limited thereto. In other embodiments, the number of opening areas OP may be two or more, and a shape of each opening area OP can be variously modified as, for example, a circle, an oval, a polygon, a star-shape, a diamond-shape, etc.

Figure 2:
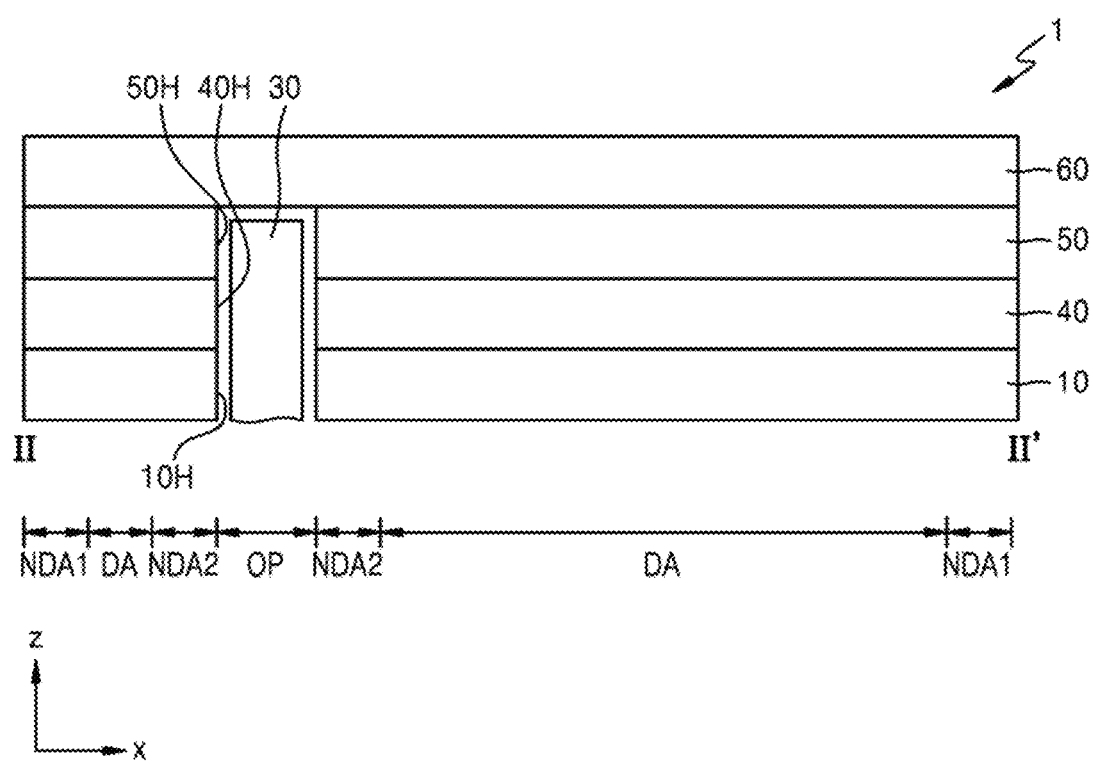
FIG. 2 is a cross-sectional view of a display apparatus according to an embodiment.
Figure 3:
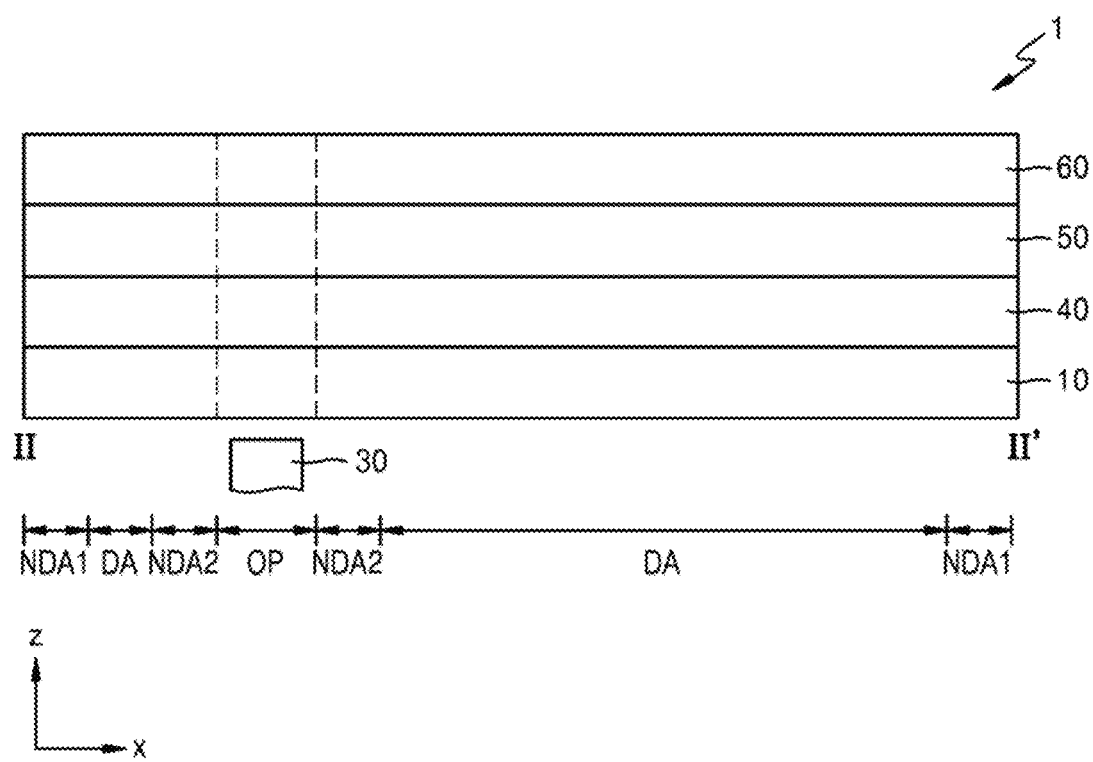
FIG. 3 is a cross-sectional view of a display apparatus according to an embodiment.

FIG. 2 is a cross-sectional view of the display apparatus 1 according to an embodiment. FIG. 3 is a cross-sectional view of the display apparatus 1 according to another embodiment.

Referring to FIGS. 2 and 3, according to an embodiment, the display apparatus 1 includes a display panel 10, an input sensing layer 40 disposed on the display panel 10, and an optical function layer 50 disposed on the input sensing layer 40. The display panel 10, the input sensing layer 40, and the optical function layer 50 are covered by a window 60. The display apparatus 1 may be one of various electronic devices, such as a mobile phone, a laptop computer, or a smart watch, etc.

According to an embodiment, the display panel 10 displays an image. The display panel 10 includes pixels disposed in the display area DA. Each pixel includes a display element and a pixel circuit connected thereto. The display element may include an organic light-emitting diode, a quantum dot organic light-emitting diode, or etc.

According to an embodiment, the input sensing layer 40 acquires an external input, such as coordinate information, according to a touch event. The input sensing layer 40 includes a sensing electrode or a touch electrode and trace lines connected to the sensing or touch electrode. The input sensing layer 40 is disposed on the display panel 10. The input sensing layer 40 can sense an external input by using a mutual capacitance method or a self-capacitance method.

According to an embodiment, the input sensing layer 40 may be formed either directly on the display panel 10 or separately formed and then combined with the display panel 10 by using an adhesive layer such as an optically clear adhesive. For example, the input sensing layer 40 can be continuously formed after the display panel 10 is formed. In an embodiment, the input sensing layer 40 is a portion of the display panel 10 and no adhesive layer need be disposed between the input sensing layer 40 and the display panel 10. Although FIG. 2 shows an embodiment in which the input sensing layer 40 is located between the display panel 10 and the optical function layer 50, in another embodiment, the input sensing layer 40 is disposed on the optical function layer 50.

According to an embodiment, the optical functional layer 50 includes an anti-reflection layer. The anti-reflection layer reduces reflectance of external light incident on the display panel 10 through the window 60. The anti-reflection layer includes a retarder and a polarizer. The retarder may be a film type or a liquid crystal coating type and may include a λ/2 retarder or a λ/4 retarder. The polarizer may also be a film type or a liquid crystal coating type. The polarizer includes a stretched-type synthetic resin film, and a liquid crystal coating-type polarizer includes liquid crystals in a predetermined initial arrangement. The retarder and the polarizer further include a protection film. The retarder and the polarizer or the protection film form a base layer of the anti-reflection layer.

In another embodiment, the anti-reflection layer includes a black matrix and color filters. The color filters are arranged to correspond to the color of light emitted from each pixel of the display panel 10. In another embodiment, the anti-reflection layer includes a destructive interference structure. The destructive interference structure includes a first reflective layer and a second reflective layer that are respectively positioned on different layers. First reflected light and second reflected light respectively reflected from the first reflective layer and the second reflective layer undergo destructive interference, which reduces a reflectance of external light.

According to an embodiment, the optical function layer 50 includes a lens layer. The lens layer improves the light-emitting efficiency of light that is emitted from the display panel 10 or reduces color deviation. The lens layer includes a layer of concave or protruding lenses or a plurality of layers respectively having different refractive indices. The optical function layer 50 may include both or any one of the anti-reflection layer or the lens layer.

In an embodiment, the optical function layer 50 is continuously formed after the display panel 10 and the input sensing layer 40 are formed. In this case, an adhesion layer need not be positioned between the optical function layer 50 and the display panel 10 or the input sensing layer 40.

According to an embodiment, the display panel 10, the input sensing layer 40, and/the optical function layer 50 each include an opening. In this regard, FIG. 2 shows an embodiment in which the display panel 10, the input sensing layer 40, and the optical function layer 50 respectively include a first opening 10H, a second opening 40H, and a third opening 50H that overlap one another. The first opening 10H, the second opening 40H, and the third opening 50H correspond to the opening area OP. In another embodiment, one or more of the display panel 10, the input sensing layer 40, or the optical function layer 50 does not include an opening. For example, one or two of the display panel 10, the input sensing layer 40, or the optical function layer 50 will not include an opening. Alternatively, none of the display panel 10, the input sensing layer 40, and the optical function layer 50 include an opening, as shown in FIG. 3.

As described above, according to an embodiment, the opening area OP is a component area, such as a sensor area, a camera area, a speaker area, etc., that can accommodate a component 30 that adds various functions to the display apparatus 1). The component 30 extends in the first opening 10H, the second opening 40H, and the third opening 50H as shown in FIG. 2. Alternatively, the component 30 is disposed under the display panel 10, as shown in FIG. 3.

According to an embodiment, the component 30 includes an electronic element.

For example, the component 30 includes an electronic element that uses light or sound. For example, the electronic element includes a sensor that outputs or receives light such as an infrared sensor, a camera that receives light and captures an image, a sensor that measures distance by outputting and sensing light or sound or recognizes a fingerprint, a small-sized lamp that outputs light, a speaker that outputs sound, etc. An electronic element can use light in various wavelength bands, such as visible light, infrared light, ultraviolet light, etc. In some embodiments, the opening area OP is a transmission area through which light or sound is either transmitted from or received by the component 30.

In another embodiment, when the display apparatus 1 is used as a smart watch or an instrument panel of a vehicle, the component 30 may be a member such as a hand of a watch or a pin providing certain information, such as a velocity of a vehicle. When the display apparatus 1 includes a clock or an instrument panel of a vehicle, the component 30 is externally exposed through the window 60, and the window 60 includes an opening that corresponds to the opening area OP.

As described above, according to an embodiment, the component 30 include element(s) related to functions of the display panel 10 or elements such as accessories that improve the aesthetic function of the display panel 10. Although not shown in FIGS. 2 and 3, a layer that includes an optically clear adhesive, etc., may be disposed between the window 60 and the optical function layer 50.

Figure 4:
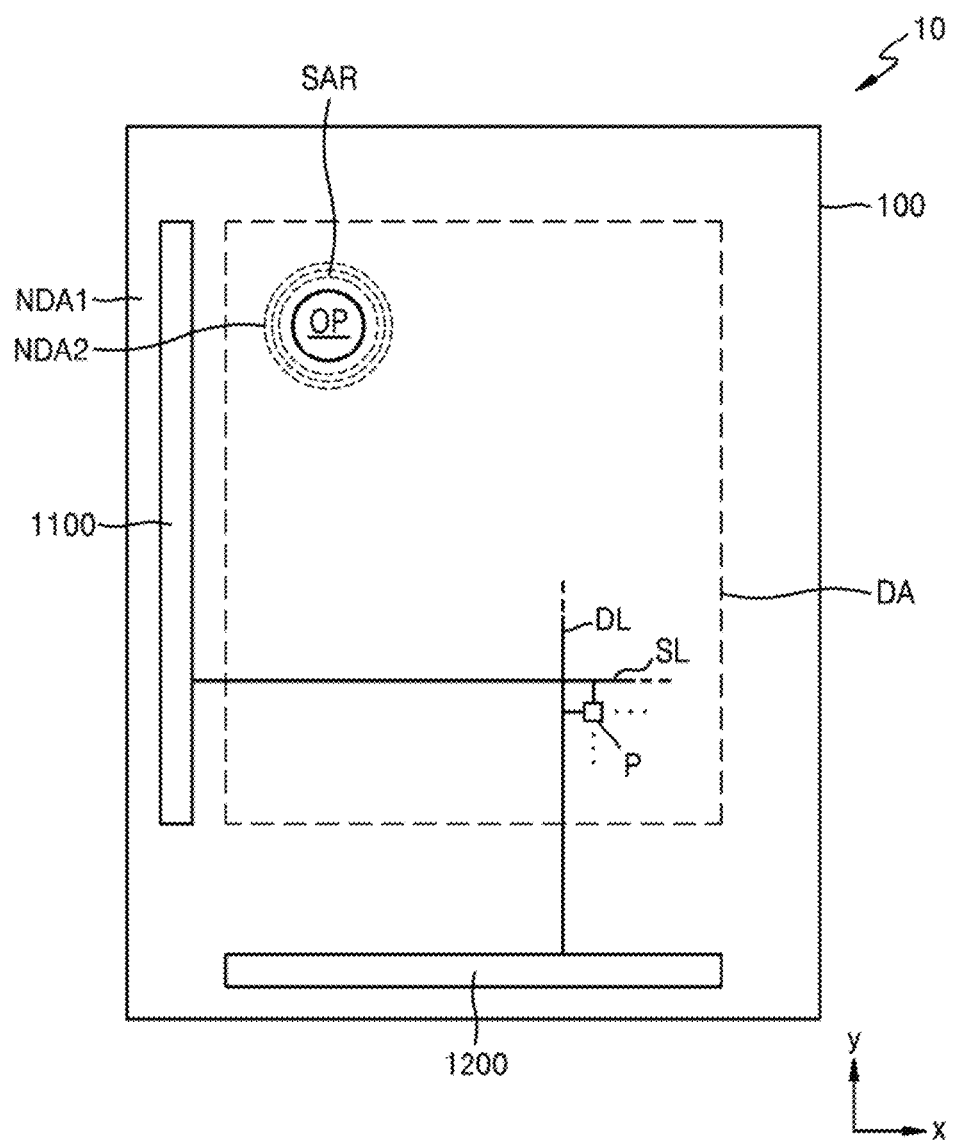
FIG. 4 is a top-plan view of a display panel according to embodiments.
Figure 5:
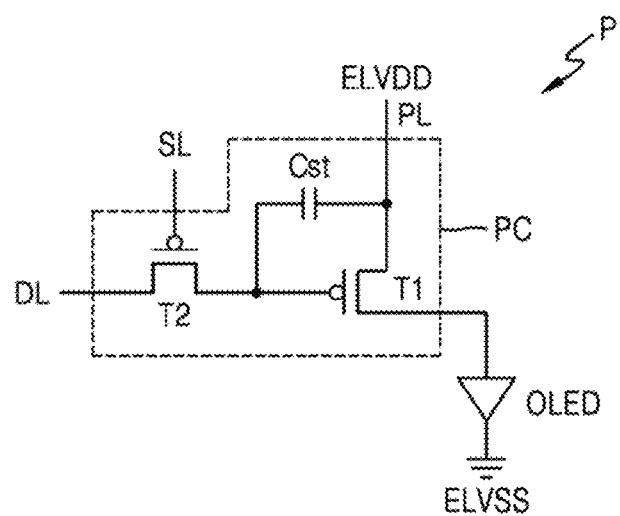
FIG. 5 is an equivalent circuit diagram of a pixel in a display panel according to embodiments.

FIG. 4 is a top-plan view of a display panel 10 according to embodiments. FIG. 5 is an equivalent circuit diagram of a pixel in the display panel 10 according to embodiments.

Referring to FIGS. 4 and 5, according to an embodiment, the display panel 10 include the opening area OP, the display area DA, the second non-display area NDA2, and the first non-display area NDA1.

According to an embodiment, the display panel 10 includes a plurality of pixels P disposed in the display area DA. As shown in FIG. 5, each of the plurality of pixels P includes a pixel circuit PC and an organic light-emitting diode OLED as a display element connected to the pixel circuit PC. The pixel circuit PC includes a first thin film transistor T1, a second thin film transistor T2, and a storage capacitor Cst. Each pixel P may emit one of red, green, or blue light, or emit one of red, green, blue, or white light from the organic light-emitting diode.

According to an embodiment, the second thin film transistor T2, which is a switching thin film transistor, is connected to a scan line SL and a data line DL and transmits a data voltage received from the data line DL to the first thin film transistor T1 based on a switching voltage received from the scan line SL. The storage capacitor Cst is connected to the second thin film transistor T2 and a driving voltage line PL and stores a voltage that corresponds to a difference between a voltage received from the second thin film transistor T2 and a first power voltage ELVDD received from the driving voltage line PL.

According to an embodiment, the first thin film transistor T1, which is a driving thin film transistor, is connected to the driving voltage line PL and the storage capacitor Cst and controls a driving current flowing from the driving voltage line PL to the organic light-emitting diode to correspond to a value of the voltage stored in the storage capacitor Cst. The organic light-emitting diode emits light having a certain luminance in response to the driving current. An opposite electrode, such as a cathode, of the organic light-emitting diode receives a second power voltage ELVSS.

According to an embodiment, the pixel circuit PC is described with reference to FIG. 5 as including two thin film transistors and one storage capacitor, but embodiments are not limited thereto. In other embodiments, the number of transistors and the number of storage capacitors can be variously modified according to the design of the pixel circuit PC. For example, the pixel circuit PC may further include four or more thin film transistors in addition to the two thin film transistors described above.

According to an embodiment, a scan driver 1100 that transmits a scan signal to each pixel P, a data driver 1200 that transmits a data signal to each pixel P, and a main power wire that transmits the first power voltage ELVDD and the second power voltage ELVSS are disposed in the first non-display area NDA1. Although the data driver 1200 is shown as being disposed adjacent to a side of a substrate 100 in FIG. 5, in another embodiment, the data driver 1200 is arranged on a flexible printed circuit board (FPCB) that is electrically in contact with a pad disposed at a side of the display panel 10.

In addition, according to an embodiment, a wiring portion that transmits various signals/power to the display area DA is disposed in the first non-display area NDA1. In an embodiment, the wiring portion includes a driving circuit. For example, the driving circuit may include at least one of a scan driving circuit, a terminal portion, a driving power supply wire, or a second wire and may further include a thin film transistor that controls electrical signals transmitted to the display area DA. In addition, a partition or a trench that interrupts flow of an organic material used when manufacturing the display apparatus can be disposed in the first non-display area NDA1.

Referring to FIG. 4, according to an embodiment, the second non-display area NDA2 surrounds the opening area OP on a plane. The second non-display area NDA2 and the opening area OP are each lack a display element, such as an organic light-emitting diode, that emits light, and signal lines that transmit signals to the pixels P arranged around the opening area OP can pass through the second non-display area NDA2.

According to an embodiment, an extra groove is formed in the second non-display area NDA2 in addition to the signal lines. In an embodiment, a plurality of grooves are provided in the second non-display area NDA2 that are spaced apart from each other.

Figure 6:
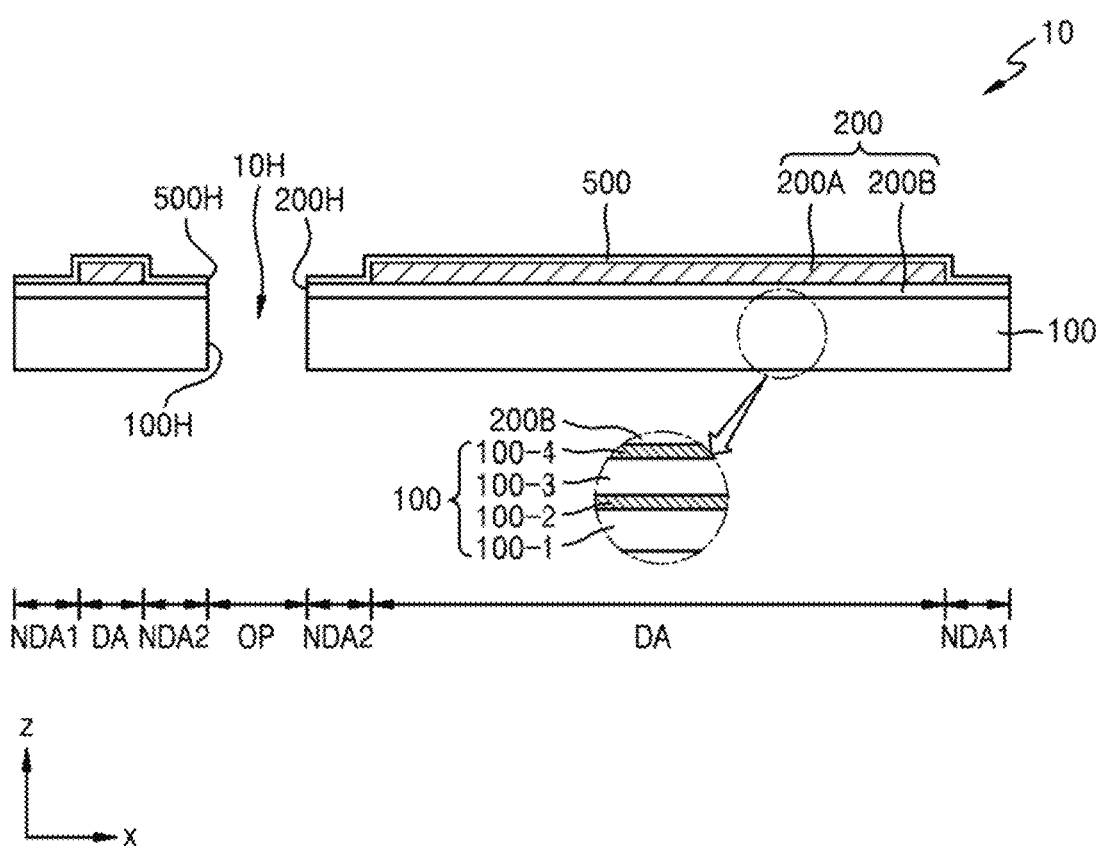
FIG. 6 is a cross-sectional view of a display panel according to an embodiment.
Figure 7:
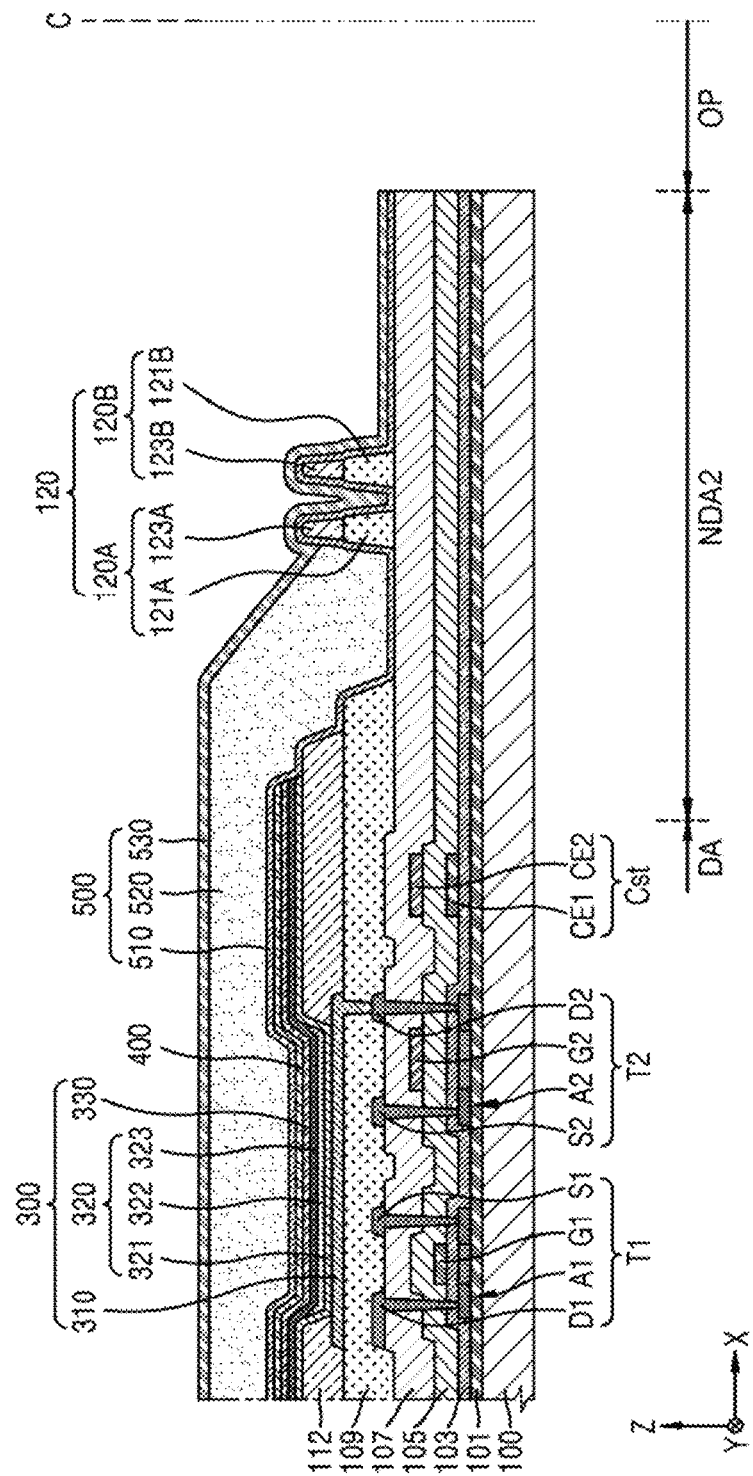
FIG. 7 is a cross-sectional view of a display panel shown in FIG. 6.

FIG. 6 is a cross-sectional view of the display panel 10 according to an embodiment. FIG. 7 is a cross-sectional view of the display panel 10 shown in FIG. 6. In FIGS. 6 and 7, reference letter C denotes an arbitrary straight line that passes through a center of the opening area OP.

Referring to FIGS. 6 and 7, according to an embodiment, the display panel 10 includes a display layer 200 disposed on the substrate 100. The substrate 100 may include glass or a polymer resin. The substrate 100 may include multiple layers. For example, the substrate 100 includes a first base layer 100-1, a first barrier layer 100-2, a second base layer 100-3, and a second barrier layer 100-4, as shown in an enlarged view of FIG. 6.

According to an embodiment, the first base layer 100-1 and the second base layer 100-3 each include a polymer resin. For example, the first base layer 100-1 and the second base layer 100-3 each include a polymer resin such as polyether sulfone, polyarylate, polyetherimide, polyethylene naphthalate, polyethylene terephthalate, polyphenylene sulfide, polyimide, polycarbonate, cellulose triacetate, or cellulose acetate propionate, etc. The above-mentioned polymer resins are transparent.

According to an embodiment, the first barrier layer 100-2 and the second barrier layer 100-4, which prevent permeation of external foreign materials, may each include a single layer or multiple layers including an inorganic material such as silicon nitride ($SiN_x$) or silicon oxide ($SiO_x$).

According to an embodiment, the display layer 200 includes a plurality of pixels. The display layer 200 includes a display element layer 200A that includes display elements in each pixel, and a pixel circuit layer 200B that includes pixel circuits and insulating layers in each pixel. In this case, the insulating layer of the pixel circuit layer 200B may include at least one of a buffer layer 101, a first gate insulating layer 103, a second gate insulating layer, an interlayer insulating layer 107, or a planarization layer 109 to be described below. Each of the pixel circuits includes a thin film transistor and a storage capacitor, and each of the display elements includes an organic light-emitting diode. FIG. 7 illustrates a first thin film transistor T1, a second thin film transistor T2, a storage capacitor Cst, and an OLED 300.

According to an embodiment, the display elements in the display layer 200 are covered by an encapsulation member such as a thin film encapsulation layer 500, and the thin film encapsulation layer 500 includes at least one inorganic encapsulation layer and at least one organic encapsulation layer. When the display panel 10 includes a polymer resin substrate 100 and the thin film encapsulation layer 500 includes an inorganic encapsulation layer and an organic encapsulation layer, the flexibility of the display panel 10 can be enhanced.

According to an embodiment, the display panel 10 includes the first opening 10H that penetrates the display panel 10. The first opening 10H is located in the opening area OP. In FIG. 6, the substrate 100 and the thin film encapsulation layer 500 respectively include penetration holes 100H and 500H that correspond to the first opening 10H of the display panel 10. The display layer 200 also includes a penetration hole 200H that corresponds to the opening area OP.

According to an embodiment, the display panel 10 includes the substrate 100, which includes the display area DA and non-display areas, and the thin film encapsulation layer 500 that seals the display area DA and the non-display areas. In an embodiment, the display panel 10 includes the display layer 200 and the thin film encapsulation layer 500 as described above.

According to an embodiment, a buffer layer 101 that is disposed on the substrate 100 can reduce or prevent permeation of foreign material, humidity, or external air from a lower portion of substrate 100 and provides a planarized surface on the substrate 100. The buffer layer 101 may include an inorganic material such as an oxide or a nitride, an organic material, or an organic-inorganic complex material and may include a single layer or multiple layers of the inorganic material and the organic material.

According to an embodiment, the first thin film transistor T1 includes a semiconductor layer A1, a first gate electrode G1, a source electrode S1, and a drain electrode D1, and the second film transistor T2 includes a semiconductor layer A2, a second gate electrode G2, a source electrode S2, and a drain electrode D2.

Hereinafter, an embodiment in which the first thin film transistor T1 and the second thin film transistor T2 are top gate type transistors is shown. However, embodiments are not limited thereto and in other embodiments, various other types of thin film transistors, such as a bottom gate type transistor, are used.

Hereinafter, an embodiment is described in which two transistors, the first thin film transistor T1 and the second thin film transistor T2, are provided, but embodiments are not limited thereto. In other embodiments, the display apparatus may use two or more thin film transistors T1 and T2 for one pixel. The number of thin film transistors can be variously modified, and in some embodiments, six to seven thin film transistors are used in one pixel.

According to an embodiment, the semiconductor layers A1 and A2 may include amorphous silicon or polycrystalline silicon. In another embodiment, the semiconductor layers A1 and A2 include an oxide of at least one of indium (In), gallium (Ga), stanium (Sn), zirconium (Zr), vanadium (V), hafnium (Hf), cadmium (Cd), germanium (Ge), chromium (Cr), titanium (Ti), or zinc (Zn). The semiconductor layers A1 and A2 each include a channel area and a source area and a drain area, which have higher carrier concentrations than the channel area.

According to an embodiment, the first gate electrode G1 is disposed on the semiconductor layer A1 with a first gate insulating layer 103 interposed between the semiconductor layer A1 and the first gate electrode G1. The first gate electrode G1 includes one or more of molybdenum (Mo), aluminum (Al), copper (Co), or titanium (Ti), etc., and may include a single layer or multiple layers. For example, the first gate electrode G1 includes a single Mo layer.

According to an embodiment, the first gate insulating layer 103 insulates the semiconductor layer A1 from the first gate electrode G1 and includes one of silicon dioxide ($SiO_2$), silicon nitride ($SiN_x$), silicon oxynitride (SiON), aluminum oxide ($Al_2O_3$), titanium dioxide ($TiO_2$), tantalum oxide ($Ta_2O_5$), hafnium dioxide ($HfO_2$), or zinc peroxide ($ZnO_2$), etc.

According to an embodiment, the second gate electrode G2 is disposed on the semiconductor layer A2 with the first gate insulating layer 103 and a second gate insulating layer 105 interposed between the semiconductor layer A2 and the second gate electrode G2. The second gate electrode G2 includes conductive materials, such as Mo, Al, Cu, or Ti, etc., and may include multiple layers or a single layer that includes one or more of the above-mentioned materials. For example, the second gate electrode G2 may include a single Mo layer or multiple layers with a Mo/Al/Mo structure.

According to an embodiment, the second gate insulating layer 105 includes an inorganic material that includes an oxide or a nitride. For example, the second gate insulating layer 105 includes one of $SiO_2$, $SiN_x$, SiON, $Al_2O_3$, $TiO_2$, $Ta_2O_5$, $HfO_2$, or $ZnO_2$, etc.

According to an embodiment, the source electrodes S1 and S2 and the drain electrodes D1 and D2 are disposed on an interlayer insulating layer 107. The source electrodes S1 and S2 and the drain electrodes D1 and D2 each include a conductive material, such as Mo, Al, Cu, or Ti, etc., and may include a single layer or multiple layers that include one or more of the above-mentioned materials. For example, the source electrodes S1 and S2 and the drain electrodes D1 and D2 each include multiple layers of Ti/Al/Ti.

According to an embodiment, the interlayer insulating layer 107 includes one of $SiO_x$, $SiN_x$, SiON, $Al_2O_3$, $TiO_2$, $Ta_2O_5$, $HfO_2$, or $ZnO_2$, etc.

As described above, according to an embodiment, the first gate electrode G1 of the first thin film transistor T1 and the second gate electrode G2 of the second thin film transistor T2 are respectively disposed on different layers. Accordingly, driving ranges of the first thin film transistor T1 and the second thin film transistor T2 can be adjusted differently.

According to an embodiment, the storage capacitor Cst includes a first electrode CE1 and a second electrode CE2. The first electrode CE1 of the storage capacitor Cst is disposed on a same layer as the first gate electrode G1 and includes a same material as the first gate electrode G1. The second electrode CE2 of the storage capacitor Cst overlaps the first electrode CE1 with the second gate insulating layer 105 interposed between the second electrode CE2 and the second gate electrode 105. The second electrode CE2 is disposed on a same layer as the second gate electrode G2 and includes a same material as the second gate electrode G2.

In FIG. 7, according to an embodiment, the storage capacitor Cst does not overlap the first thin film transistor T1 or the second thin film transistor T2. However, embodiments of the storage capacitor Cst are not limited thereto. For example, the storage capacitor Cst can overlap the first thin film transistor T1. In some embodiments, the first electrode CE1 of the storage capacitor Cst is integrally formed with the first gate electrode G1. That is, the first gate electrode G1 of the first thin film transistor T1 functions as the first electrode CE1 of the storage capacitor Cst.

According to an embodiment, a planarization layer 109 is disposed on the source electrodes S1 and S2 and the drain electrodes D1 and D2, and the organic light-emitting diode (OLED) 300 is disposed on the planarization layer 109. The planarization layer 109 may include a single layer or multiple layers and includes a film that includes an organic material. The organic material may include a general commercial polymer such as polymethylmethacrylate (PMMA) or polystyrene (PS), a polymer derivative having a phenolic group, an acrylic polymer, an imide-based polymer, an aryl ether-based polymer, an amide-based polymer, a fluoride-based polymer, a p-xylene based polymer, a vinyl alcohol-based polymer, or a blend thereof. In addition, the planarization layer 109 includes a complex stack of an inorganic insulating layer and an organic insulating layer.

According to an embodiment, the organic light-emitting diode 300 is disposed on the planarization layer 109 in the display area DA of the substrate 100. The organic light-emitting diode 300 includes a pixel electrode 310, an opposite electrode 330, and an intermediate layer 320 interposed between the pixel electrode 310 and the opposite electrode 330.

According to an embodiment, the pixel electrode 310 is in contact with any one of the source electrode S1 or the drain electrode D1 of the first thin film transistor T1 through an opening formed in the planarization layer 109, the interlayer insulating layer 107, the second gate insulating layer 105 and the first gate insulating layer 103 and is electrically connected to the first thin film transistor T1. The pixel electrode 310 includes a reflective electrode. For example, the pixel electrode 310 includes a reflecting film that includes at least one of silver (Ag), magnesium (Mg), aluminum (Al), platinum (Pt), palladium (Pd), gold (Au), nickel (Ni), neodymium (Nd), iridium (Ir), or chromium (Cr), or a compound thereof, etc., and a transparent or translucent electrode layer disposed on the reflecting film. The transparent or translucent electrode layer includes at least one of indium tin oxide (ITO), indium zinc oxide (IZO), zinc oxide (ZnO), indium oxide ($In_2O_3$), indium gallium oxide (IGO), or aluminum zinc oxide (AZO).

According to an embodiment, a pixel defining layer 112 is disposed on the planarization layer 109. The pixel defining layer 112 defines pixels by having an opening that corresponds to each sub-pixel, that is, an opening that at least exposes a center portion of the pixel electrode 310. In addition, the pixel defining layer 112 prevents an arc, etc., from occurring at edges of the pixel electrode 310 by increasing the distances between the edges of the pixel electrode 310 and the opposite electrode 330 above the pixel electrode 310. The pixel defining layer 112 includes an organic layer such as polyimide or hexamethyldisiloxane (HMDSO).

According to an embodiment, the intermediate layer 320 includes an emission layer 322. The emission layer 322 includes a fluorescent or phosphorescent organic material that emits red, green, or blue light and is patterned to correspond to the pixel P in the display area DA. The intermediate layer 320 includes at least one functional layer, such as a first functional layer 321 between the emission layer 322 and the pixel electrode 310 and a second functional layer 323 between the emission layer 322 and the opposite electrode 330.

According to an embodiment, the first functional layer 321 is any one of a hole injection layer (HIL) or a hole transport layer (HTL).

According to an embodiment, the HIL receives holes released from the anode, and the HTL transports the holes of the HIL to the emission layer 322.

According to an embodiment, the HIL includes at least one of a phthalocyanine compound such as copper phthalocyanine, N—N'-diphenyl-N,N'-bis-[4-(phenyl-m-tolyl-amino)-phenyl]-biphenyl-4,4]diamine (DNTPD), 4,4',4''-tris(3-methylphenylphenylamino) triphenylamine (m-MTDATA), 4,4',4''-Tris(N,N-diphenylamino)triphenylamine (TDATA), 4,4',4''-tris{N,-(2-naphthyl)-N-phenylamino-triphenylamine (2T-NATA), poly(3,4-ethylenedioxythiophene) (PEDOT)/poly(4-styrenesulfonate) (PSS), polyaniline (Pani)/dodecylbenzenesulfonic acid (DBSA), Pani/camphor sulfonic acid (CSA), or Pani/Pss, etc., but embodiments of the HIL are not limited thereto.

According to an embodiment, the HTL includes at least one of a carbazole derivative such as N-phenylcarbazole or polyvinylcarbazole, a triphenylamine-based material such as N—N'-bis(3-methylphenyl)-N,N'-diphenyl-[1,1-biphenyl]-4,4'-diamine (TPD), N,N'-di(1-naphthyl)-N,N'-diphenylbenzidine (NPB), or 4,4',4''-tris(N-carbazolyl)triphenylamine (TCTA), etc., but embodiments of the HTL are not limited thereto.

According to an embodiment, the second functional layer 323 is any one of an electron transport layer (ETL) or an electron injection layer (EIL).

According to an embodiment, the EIL receives electrons released from the cathode, and the ETL transports the electrons of the EIL to the emission layer 322.

According to an embodiment, the ETL includes at least one of Alq3, 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4,-oxadiazole (tBu-BPD), Bis(2-methyl-8-quinolinolato-N1, O8-(1,1'-Biphenyl-4-olato)aluminum (BAlq), beryllium bis (benzoquinolin-10-olate) (Bebq2), or 9,10-dinaphthalene-2-yl)anthrascene (ADN), etc., but embodiments of the ETL are not limited thereto.

According to an embodiment, the EIL includes at least one of lithium fluoride (LiF), sodium chloride (NaCl), cesium fluoride (CsF), lithium oxide (Li2O), barium oxide (BaO), or lithium quinolate (Liq), etc., but embodiments of the EIL are not limited thereto.

The intermediate layer 320 is not limited to the above embodiments and may have various structures in other embodiments. The intermediate layer 320 may include a layer integrally formed over the plurality of pixel electrodes 310 or include a layer patterned to correspond to each of the plurality of pixel electrodes 310. Hereinafter, for convenience of explanation, an embodiment in which the emission layer 322 is patterned to correspond to each of the plurality of pixel electrodes 310 and the first functional layer 321 and the second functional layer 323 are integrally disposed on the substrate 100 over the plurality of pixel electrodes 310 will be described in detail.

According to an embodiment, the opposite electrode 330 is disposed on the display area DA and covers the display area DA, as shown in FIG. 7. That is, the opposite electrode 330 is integrally formed with respect to a plurality of organic light-emitting diodes and corresponds to the plurality of pixel electrodes 310. In another embodiment, the opposite electrode 330 covers an upper portion of the display area DA and an upper portion of a portion of the non-display area NDA. Hereinafter, for convenience of explanation, an embodiment in which the opposite electrode 330 covers the upper portion of the display area DA and the upper portion of a portion of the non-display area NDA will be described in detail.

According to an embodiment, the opposite electrode 330 includes a transmissive electrode. For example, the opposite electrode 330 includes a transparent or translucent electrode and includes a metal thin film with a small work function that includes one or more of Li, calcium (Ca), LiF/Ca, Lif/Al, Al, Ag, Mg, or a compound thereof. In addition, a transparent conductive oxide film such as ITO, IZO, ZnO, or $In_2O_3$ is further disposed on the metal thin film.

According to an embodiment, since the pixel electrode 310 is a reflective electrode and the opposite electrode 330 is a transmissive electrode, the display apparatus is a top-emission type in which light emitted from the intermediate layer 320 is emitted toward the opposite electrode 330. However, embodiments are not limited thereto, and in other embodiments, the display apparatus is a bottom-emission type in which the light emitted from the intermediate layer 320 is emitted toward the substrate 100. In this case, the pixel electrode 310 includes a transparent or translucent electrode, and the opposite electrode 330 includes a reflecting electrode. In addition, a display apparatus of a present embodiment can be a dual emission type that emits light in two directions, both top and bottom.

According to an embodiment, a capping layer 400 is disposed on the opposite electrode 330. In this case, the capping layer 400 is in direct contact with the opposite electrode 330. The capping layer 400 has a refractive index that is lower than that of the opposite electrode 330 and higher than that of a first inorganic encapsulation layer 510. The capping layer 400 reduces a ratio of light emitted from the intermediate layer 320 that is reflected, thereby improving light efficiency.

According to an embodiment, a thickness of an end portion of at least one of the first functional layer 321, the emission layer 322, the second functional layer 323, the opposite electrode 330, and the capping layer 400 gradually decreases toward the opening area OP as shown in area B of FIG. 7. The flat upper surface of the pixel defining layer 112 has an area in which the thickness of the end portion of at least one of the first functional layer 321, the emission layer 322, the second functional layer 323, the opposite electrode 330, and the capping layer 400 changes. In particular, the area in which the thickness of the end portion of at least one of the first functional layer 321, the emission layer 322, the second functional layer 323, the opposite electrode 330, and the capping layer 400 changes is an flat portion of the upper surface of the pixel defining layer 112.

According to an embodiment, the thin film encapsulation layer 500 covers the display area DA and the non-display areas NDAs to prevent permeation of external moisture and oxygen. The thin film encapsulation layer 500 includes at least one organic encapsulation layer and at least one inorganic encapsulation layer. FIG. 7 shows an example in which the thin film encapsulation layer 500 includes two inorganic encapsulation layers, such as first and second inorganic encapsulation layer 510 and 530, and one organic encapsulation layer 520, but the stacking order and number layers is not limited to an embodiment shown in FIG. 7.

According to an embodiment, the first inorganic encapsulation layer 510 covers the opposite electrode 330 and includes one or more of $SiO_x$, $SiN_x$, or $SiO_N$, etc. Other layers, such as the capping layer 400, are interposed between the first inorganic encapsulation layer 510 and the opposite electrode 330 as needed. Since the first inorganic encapsulation layer 510 is formed along a structure located thereunder, as shown in FIG. 7, an upper surface of the first inorganic encapsulation layer 510 is not flat.

According to an embodiment, the organic encapsulation layer 520 covers the first inorganic encapsulation layer 510, and unlike the first inorganic encapsulation layer 510, an upper surface of the organic encapsulation layer 520 is approximately flat. In particular, the upper surface of the organic encapsulation layer 520 is approximately flat in a portion that corresponds to the display area DA. The organic encapsulation layer 520 includes at least one of polyethylene terephthalate, polyethylene naphthalate, polycarbonate, polyimide, polyether sulfone, polyoxymethylene, polyarylate, or hexamethyldisiloxane. The second inorganic encapsulation layer 530 covers the organic encapsulation layer 520 and includes one of $SiO_x$, $SiN_x$, or SiON, etc.

As described above, according to an embodiment, the thin film encapsulation layer 500 includes the first inorganic encapsulation layer 510, the organic encapsulation layer 520, and the second inorganic encapsulation layer 530, and by using this multiple layer structure, cracks that occur in the thin film encapsulation layer 500 do not form connections between the first inorganic encapsulation layer 510 and the organic encapsulation layer 520 or between the organic encapsulation layer 520 and the second inorganic encapsulation layer 530. By doing so, formation of paths through which external moisture or oxygen can permeate into the display area DA and the non-display areas NDAs can be prevented or minimized. The second inorganic encapsulation layer 530 is in contact with the first inorganic encapsulation layer 510 at an edge located outside the display area DA, thereby preventing the organic encapsulation layer 520 from being externally exposed.

According to an embodiment, a partition 120 is formed in the non-display area NDA of the substrate 100.

According to an embodiment, the partition 120 prevent organic material from flowing toward the edge of the substrate 100 when forming the organic encapsulation layer 520 that seals the display area DA and the non-display area NDA, thereby preventing formation of an edge tail of the organic encapsulation layer 520.

According to an embodiment, one or more of partitions 120 are provided. In an embodiment, when a plurality of partitions 120 are provided, the plurality of partitions 120 include at least a first partition 120A and a second partition 120B that are apart from each other.

According to an embodiment, at least one of the first partition 120A and the second partition 120B includes a plurality of layers. FIG. 7 shows the first partition 120A as including a first layer 121A, which includes a same material as the planarization layer 109, and a second layer 123A, which includes a same material as the pixel defining layer 112, that are stacked together, and the second partition 120B as including a first layer 121B, which includes a same material as the planarization layer 109, and a second layer 123B, which includes a same material as the pixel defining layer 112, that are stacked together. However, embodiments of the first partition 120A and the second partition 120B are not limited thereto. The structures of the first partition 120A and the second partition 120B can be variously modified in other embodiment; one of the first partition 120A and the second partition 120B may include a single layer, both of the first partition 120A and the second partition 120B may have two-layered structures, or both of the first partition 120A and the second partition 120B may have three-layered structures. In addition, the plurality of partitions 120 may further include additional partitions spaced apart from the first partition 120A and the second partition 120B.

In addition, a spacer is disposed in a flat portion of the pixel defining layer 112 that protrudes from the flat portion of the pixel defining layer 112 into the thin film encapsulation layer 500. The spacer includes an organic material such as polyimide or hexamethyldisiloxane.

According to an embodiment, since the partition 120 includes a plurality of partitions, overflow of an organic material can be more efficiently prevented when forming the organic encapsulation layer 520.

Figure 8:
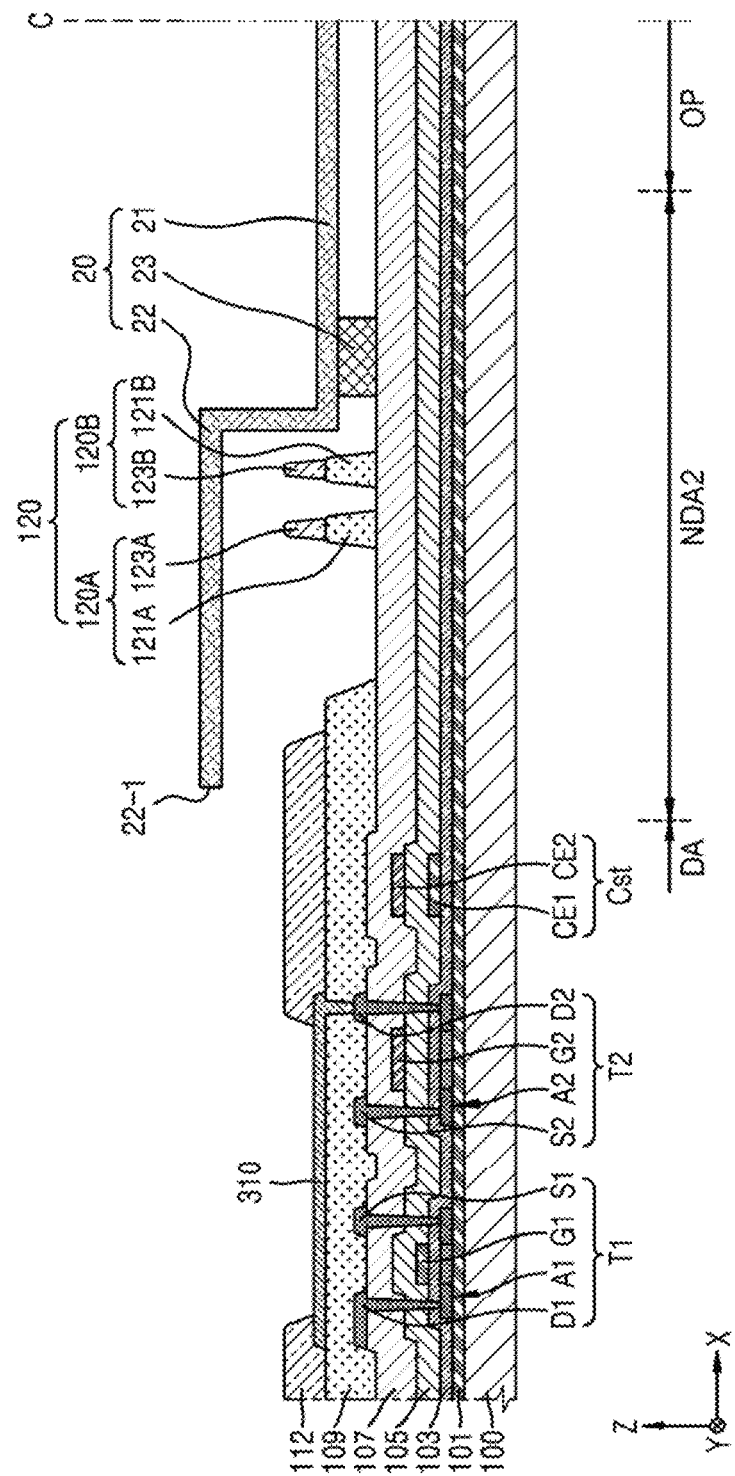
FIGS. 8 through 10 are cross-sectional views that illustrate a method of manufacturing a display panel shown in FIG. 6.
Figure 9:
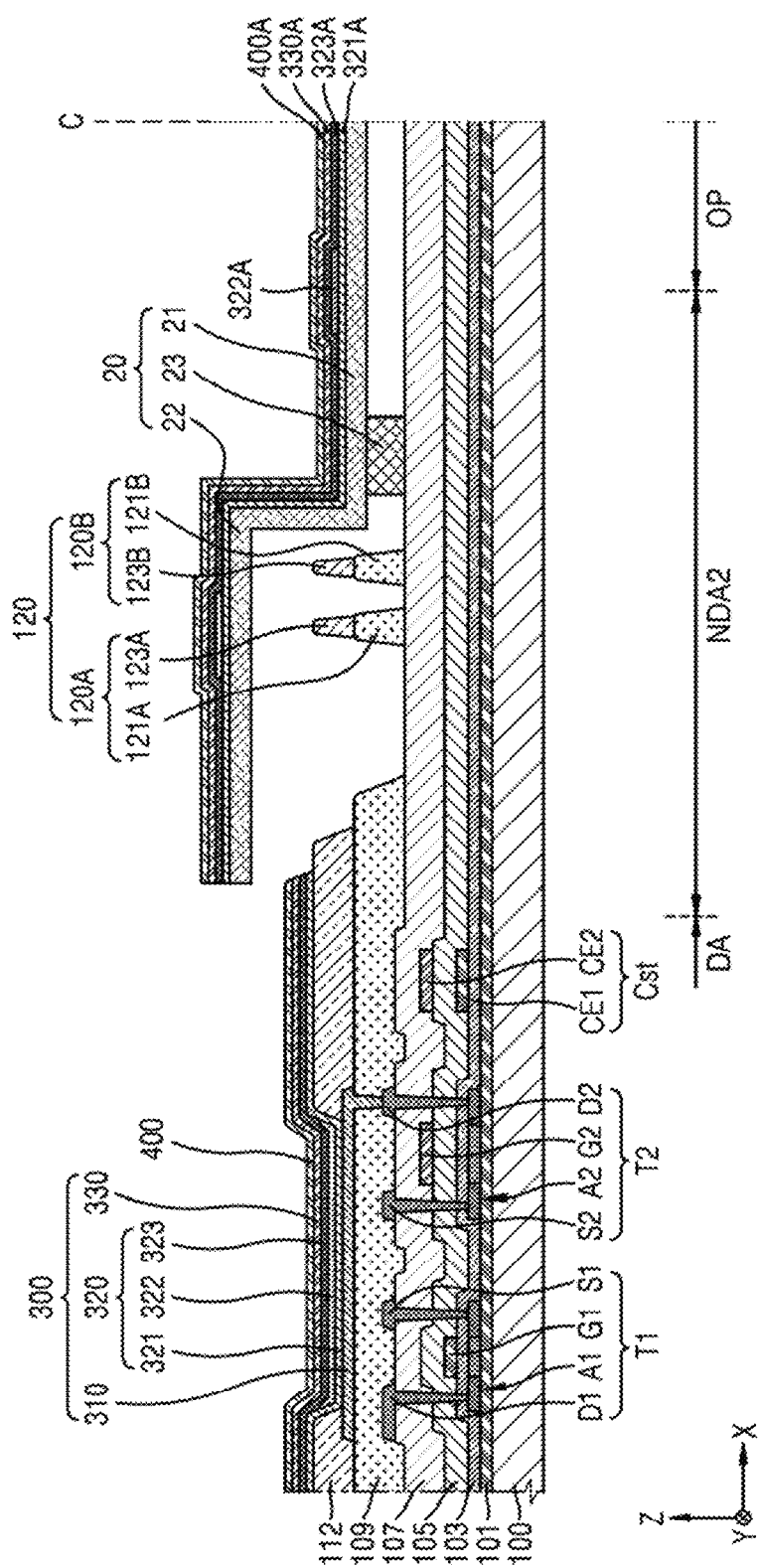
Figure 10:
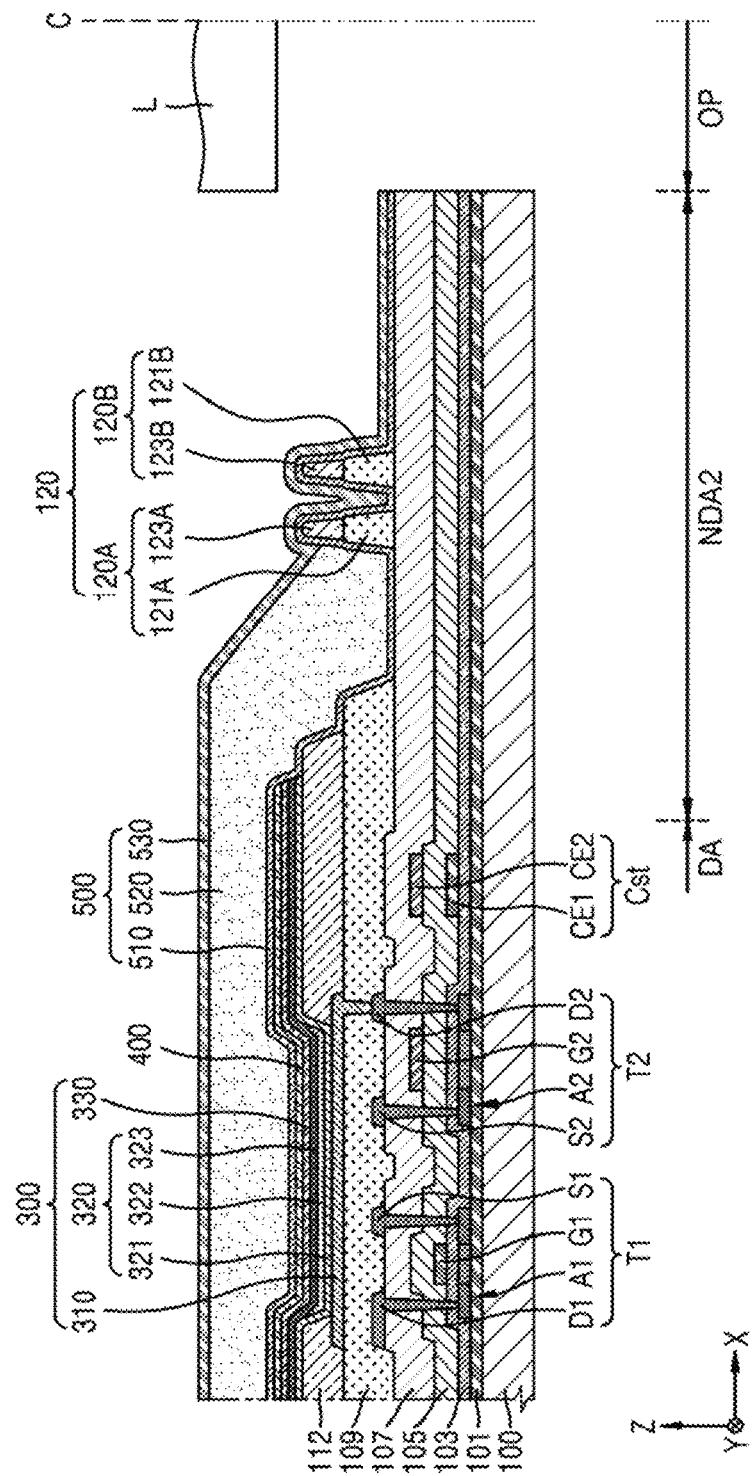

FIGS. 8 through 10 are cross-sectional views that illustrate a method of manufacturing the display panel 10 shown in FIG. 6. In FIGS. 8 through 10, the reference letter C denotes an imaginary straight line that passes through the center of the opening area OP, and reference numerals shown in FIGS. 8 through 10 that are same as those of FIGS. 6 and 7 denote same members as those of FIGS. 6 and 7.

Referring to FIGS. 8 through 10, according to an embodiment, when manufacturing the display panel 10, the organic light-emitting diode 300 is formed after forming insulating layers, a pixel circuit, etc., on the substrate 100.

According to an embodiment, either before or after forming the pixel electrode 310, a shielding unit 20 is formed on the substrate 100 to shield the opening area OP and a least a portion of the second non-display area NDA2. Hereinafter, for convenience of explanation, an embodiment will be described in detail in which the shielding unit 20 is formed on the substrate 100 after forming the pixel electrode 310 to shield the opening area OP and the entire portion of the second non-display area NDA2.

According to an embodiment, the shielding unit 20 described above includes a first shielding unit 21, a second shielding unit 22, and an adhesion unit 23. The first shielding unit 21 and the second shielding unit 22 may be integrally or separately formed. For example, the first shielding unit 21 and the second shielding unit 22 include a heat-resistant material that has a melting point in a range from 350 degrees Celsius or higher to 450 degrees Celsius or lower. In particular, the first shielding unit 21 and the second shielding unit 22 are manufactured by an ejaculation method, etc., by using polyimide resin; alternatively, the first shielding unit 21 and the second shielding unit 22 are formed as films and attached or combined to each other. In another embodiment, the first shielding unit 21 and the second shielding unit 22 are integrally formed in a process of extruding or compressing a plastic or metal, etc., that includes a thermosetting material. In another embodiment, the first shielding unit 21 and the second shielding unit 22 are formed from a synthetic resin or metal, etc., by using a mold.

According to an embodiment, the first shielding unit 21 and the second shielding unit 22 described above are formed at different heights. In an embodiment, a portion of the first shielding unit 21 is bent and connected to the second shielding unit 22. In an embodiment, the first shielding unit 21 and the second shielding unit 22 respectively shield different portions of the substrate. For example, the first shielding unit 21 shields the opening area OP and a portion of the second non-display area NDA2. The second shielding unit 22 shields at least a portion of the second non-display area NDA2. In addition, the second shielding unit 22 does not contact the uppermost layer of the layers stacked on the substrate 100 that are shielded by the second shielding unit 22. That is, a lower surface of the second shielding unit 22 is spaced apart from and above the uppermost surface of the pixel defining layer 112 in the second non-display area NDA2. In an embodiment, when an extra spacer is disposed on the pixel defining layer 112, the lower surface of the second shielding unit 22 may or may not be in contact with an uppermost surface of the spacer.

According to an embodiment, the adhesion unit 23 includes an adhesion member. For example, the adhesion unit 23 includes a micro-sized vacuum grease. In another embodiment, the adhesion unit 23 includes a silicon-based adhesive that is heat-resistant and is not denatured by high temperatures.

According to an embodiment, the adhesion unit 23 described above can be disposed in various forms on the lower surface of the first shielding unit 21. For example, the adhesion unit 23 is formed as a ring on the lower surface of the first shielding unit 21. In an embodiment, the opening area OP is inside the ring-shaped adhesion unit 23. In another embodiment, a plurality of adhesion units 23 are disposed separately from one another on the lower surface of the first shielding unit 21. In another embodiment, the adhesion unit 23 has a plate shape that completely shields the opening area OP. Hereinafter, for convenience of explanation, an embodiment in which the adhesion unit 23 is ring shaped will be described in detail.

According to an embodiment, the adhesion unit 23 is disposed at various positions. The adhesion unit 23 may be disposed outside of the opening area OP or disposed to completely shield the opening area OP. In an embodiment, the adhesion unit 23 has various forms at various positions in the second non-display area NDA2.

According to an embodiment, the substrate 100 and the shielding unit 20 are aligned after the pixel electrode 310 is formed, and the shielding unit 20 is disposed on the substrate 100 by using a robot arm, etc. In an embodiment, an extra alignment mark is formed on the substrate 100 to accurately position the shielding unit 20. In an embodiment, the shielding unit 20 includes an alignment mark that corresponds to the alignment mark of the substrate 100.

According to an embodiment, the shielding unit 20 is disposed on the substrate 100 and then fixed by using the adhesion unit 23. In an embodiment, the adhesion unit 23 is fixed by adhering it to the substrate 100 or an insulating layer, etc.

According to an embodiment, after fixing the shielding unit 20 as shown in FIG. 9, the first functional layer 321, the emission layer 322, the second functional layer 323, the opposite electrode 330, and the capping layer 400 are sequentially formed on the substrate 100 and the shielding unit 20. In an embodiment, the first functional layer 321, the second functional layer 323, the opposite electrode 330, and the capping layer 400 are formed on the top surface of the substrate 100 in the display area DA and at least a portion of the non-display area NDA. A plurality of emission layers 322 are patterned to be spaced apart from each other on the substrate 100 and below the capping layer 400.

In an above-described embodiment, a first functional layer 321A, an emission layer 322A, a second functional layer 323A, an opposite electrode 330A, and a capping layer 400A are formed on the shielding unit 20. In an embodiment, the first functional layer 321, the emission layer 322, the second functional layer 323, the opposite electrode 330, and the capping layer 400 are not formed in the opening area OP and the portion of the non-display area NDA of the substrate 100.

In an embodiment, at least one of the first functional layer 321, the emission layer 322, the second functional layer 323, the opposite electrode 330, and the capping layer 400 includes a deposition material that vaporizes or sublimates in a −Z direction shown in FIG. 8. At least one of the first functional layer 321, the emission layer 322, the second functional layer 323, the opposite electrode 330, or the capping layer 400 is formed by deposting a deposition material on the substrate 100. In an embodiment, a deposition source that sprays the deposition material is provided in the display area DA. Due to an end portion 22-1 of the second shielding unit 22, at least one portion of the first functional layer 321, the emission layer 322, the second functional layer 323, the opposite electrode 330, and the capping layer 400 formed by spraying the deposition material have different thicknesses on the pixel defining layer 112. In this case, the thickness of at least one of the first functional layer 321, the emission layer 322, the second functional layer 323, the opposite electrode 330, and the capping layer 400 decreases away from the end portion of the second shielding unit 22.

According to an embodiment, when the above-described process is completed, the shielding unit 20 is removed from the substrate 100. At this time, the first functional layer 321A, the emission layer 322A, the second functional layer 323A, the opposite electrode 330A, and the capping layer 400A, which are formed on the shielding unit 20, are removed along with the shielding unit 20. In addition, the adhesion unit 23 can be easily removed from the insulating layer. In an embodiment, the insulating layer is not damaged when the adhesion unit 23 is removed.

According to an embodiment, the thin film encapsulation layer 500 is formed after the shielding unit 20 is removed, as described above. The thin film encapsulation layer 500 may be formed after removing the shielding unit 20 and before removing the substrate 100 and the buffer layer 101 from the opening area OP, or after removing the substrate 100 and the buffer layer 101 from the opening area OP. Hereinafter, for convenience of explanation, an embodiment in which the thin film encapsulation layer 500 is formed after removing the shielding unit 20 and before removing the substrate 100 and the buffer layer 101 from the opening area OP is described in detail.

Next, according to an embodiment, the substrate 100 and the buffer layer 101 are removed by using a removing unit L. In an embodiment, the removing unit L applies heat or light such as a laser to remove the substrate 100 and the buffer layer 101 from the opening area OP. In another embodiment, the removing unit L applies mechanical energy by using a drill, etc., to remove the substrate 100 and the buffer layer 101 from the opening area OP.

In an above-described embodiment, as the first functional layer 321, the emission layer 322, the second functional layer 323, the opposite electrode 330, and the capping layer 400 do not extend into the opening area OP, separation of layers when penetrating the opening area OP can be prevented.

In particular, in related arts, when the opening area OP is penetrated by a laser, distances between the first functional layer 321, the emission layer 322, the second functional layer 323, the opposite electrode 330, and the capping layer 400 increase due to heat from the laser. In addition, when attaching an extra film onto the first functional layer 321, the emission layer 322, the second functional layer 323, the opposite electrode 330, and the capping layer 400, and irradiating a laser to remove some layers of the opening area OP or to form a hole, due to attachment of the film, a portion of the film's adhesion member can remain on the uppermost layer, and a portion of the uppermost layer is removed together with the film, or separation occurs between the uppermost layer and a layer under the uppermost layer. Furthermore, in an above-described embodiment, burrs due to the laser can occur in the opposite electrode 330 and contaminate adjacent areas or increase roughness of the uppermost layer. In this case, since the thin film encapsulation layer 500 may not be firmly attached to the uppermost layer to prevent permeation of oxygen or moisture, the life of the organic light emitting diode 300 may decrease.

However, in the display panel 10 according to an embodiment, the first functional layer 321, the emission layer 322, the second functional layer 323, the opposite electrode 330, and the capping layer 400 do not extend into the opening area OP, and the above-mentioned phenomena do not occur around the opening area OP.

In addition, according to an embodiment, by manufacturing the display panel 10 using an above-described method, the first functional layer 321, the emission layer 322, the second functional layer 323, the opposite electrode 330, and the capping layer 400 of the opening layer OP need not be removed. Thus, not only a manufacturing period but also a defect rate of the manufactured display panel 10 can be reduced.

Figure 11:
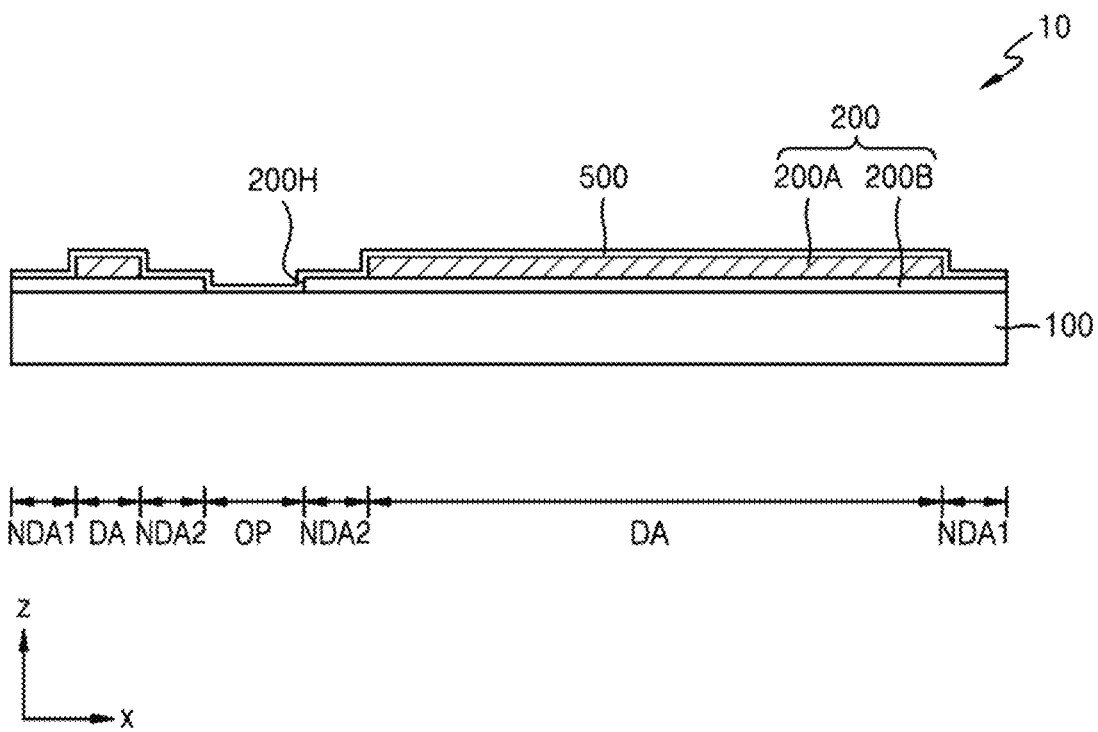
FIG. 11 is a cross-sectional view of a display panel according to an embodiment.
Figure 12:
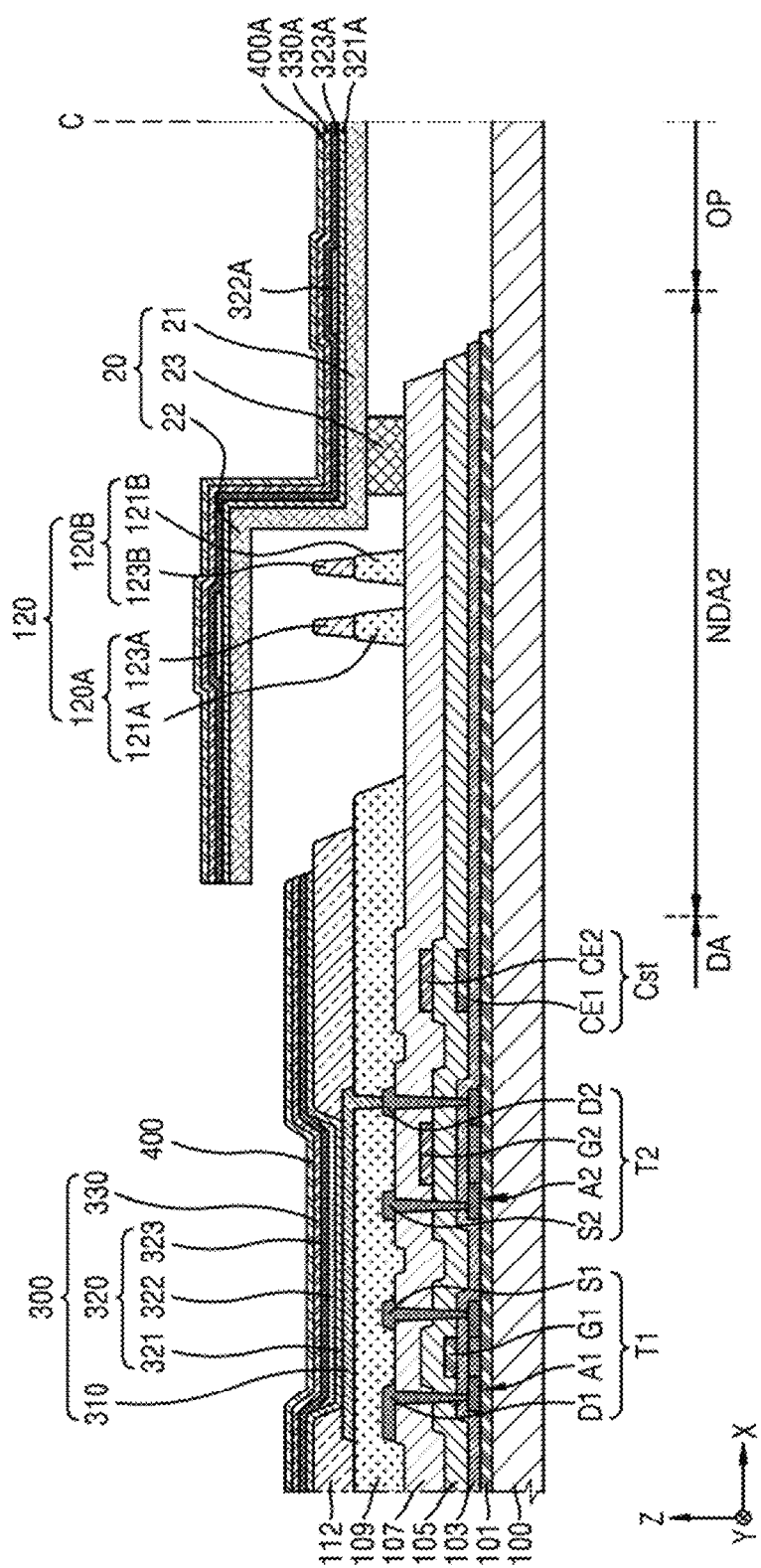
FIG. 12 is a cross-sectional view that illustrates a part of a method of manufacturing a display panel shown in FIG. 11.

FIG. 11 is a cross-sectional view of the display panel 10 according to another embodiment. FIG. 12 is a cross-sectional view that illustrates a part of a method of manufacturing the display panel 10 shown in FIG. 11. In FIGS. 11 and 12, the reference letter C denotes an imaginary straight line that passes through the center of the opening area OP, and reference numerals shown in FIGS. 11 and 12 that are same as those of FIGS. 6 and 7 denote same members as those of FIGS. 6 and 7.

Referring to FIGS. 11 and 12, according to an embodiment, the substrate 100 does not include a penetration hole that corresponds to the opening area OP. The display layer 200 does include the penetration hole 200H that corresponds to the opening area OP. The thin film encapsulation layer 500 does not include a penetration hole that corresponds to the opening area OP. In this case, the above-mentioned insulating layer is not disposed in the opening area OP. In this case, the insulating layer of the pixel circuit layer 200B is not formed in the opening area OP when each insulating layer is formed, or alternatively, the shielding unit 20 is arranged to perform the following operations and then the insulating layer of the pixel circuit layer 200B in the opening area OP is removed. Hereinafter, for convenience of description, a case in which the insulating layer of the pixel circuit layer 200B is not formed in the opening area OP when each insulating layer is formed will be mainly described in detail.

In an above-described case, the shielding unit 20 is fixed by forming the adhesion unit 23 on the insulating layer in the second non-display area NDA2. Since the shielding unit 20 is identical or similar to the shielding unit 20 described with reference to FIGS. 8 through 10, detailed description thereof will be omitted.

According to an embodiment, the display panel 10 can be identically or similarly manufactured to the display panel 10 described with reference to FIGS. 8 through 10.

According to an embodiment, after forming the pixel electrode 310 and forming the shielding unit 20 that covers to the opening area OP and the second non-display area NDA2, the first functional layer 321, the emission layer 322, the second functional layer 323, the opposite electrode 330, and the capping layer 400 are sequentially formed. In an embodiment, the first functional layer 321, the emission layer 322, the second functional layer 323, the opposite electrode 330, and the capping layer 400 are sequentially stacked on the shielding unit 20. Furthermore, in an embodiment, the second shielding unit 22 is spaced above and not in contact with upper layers of the display panel 10, and the layers of the display panel 10 are not damaged when manufacturing the display panel 10. Next, the shielding unit 20 is removed.

The display panel 10 according to an embodiment can be manufactured by forming the thin film encapsulation layer 500 on the substrate 100 after removing the shielding unit 20.

Therefore, according to an embodiment, in the display panel 10, separation of the layers when forming the holes can be minimized by not forming extra holes in the opening area OP. In addition, the opening area OP of the display panel 10 can have an increased light transmissivity as at least one of the first functional layer 321, the emission layer 322, the second functional layer 323, the opposite electrode 330, and the capping layer 400 does not extend into the opening area OP.

According to an embodiment, the display panel 10 can be manufactured quickly in an above-described method, and the manufactured display panel 10 has a high light transmissivity in the opening area OP.

Figure 13:
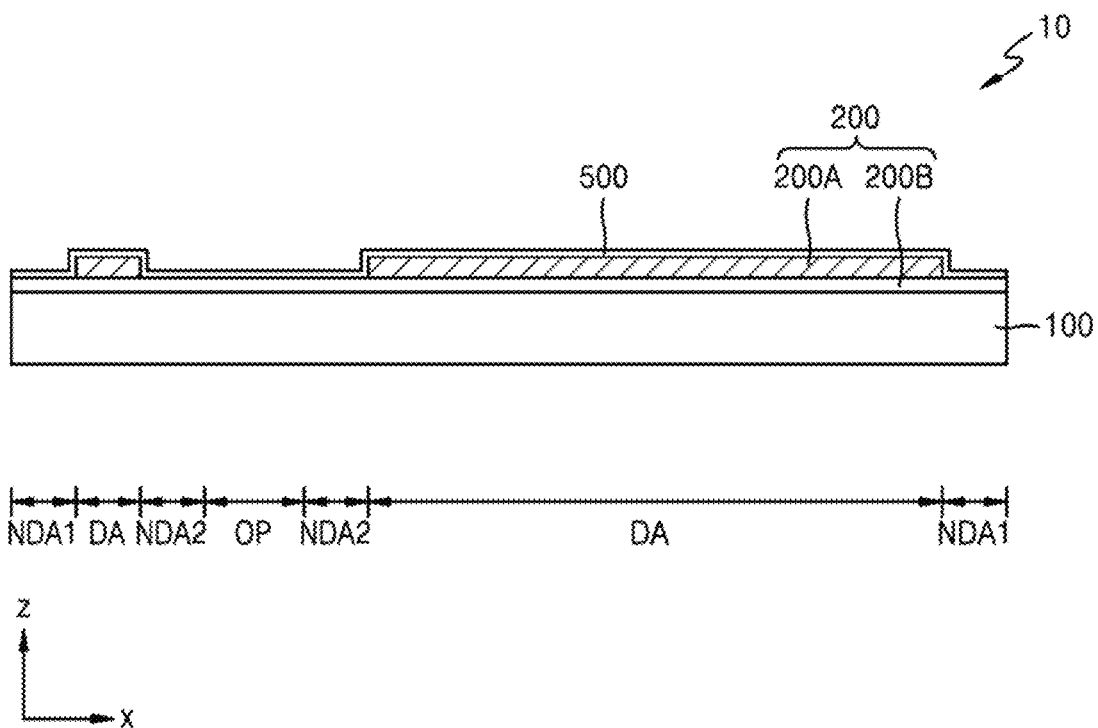
FIG. 13 is a cross-sectional view of a display panel according to another embodiment.
Figure 14:
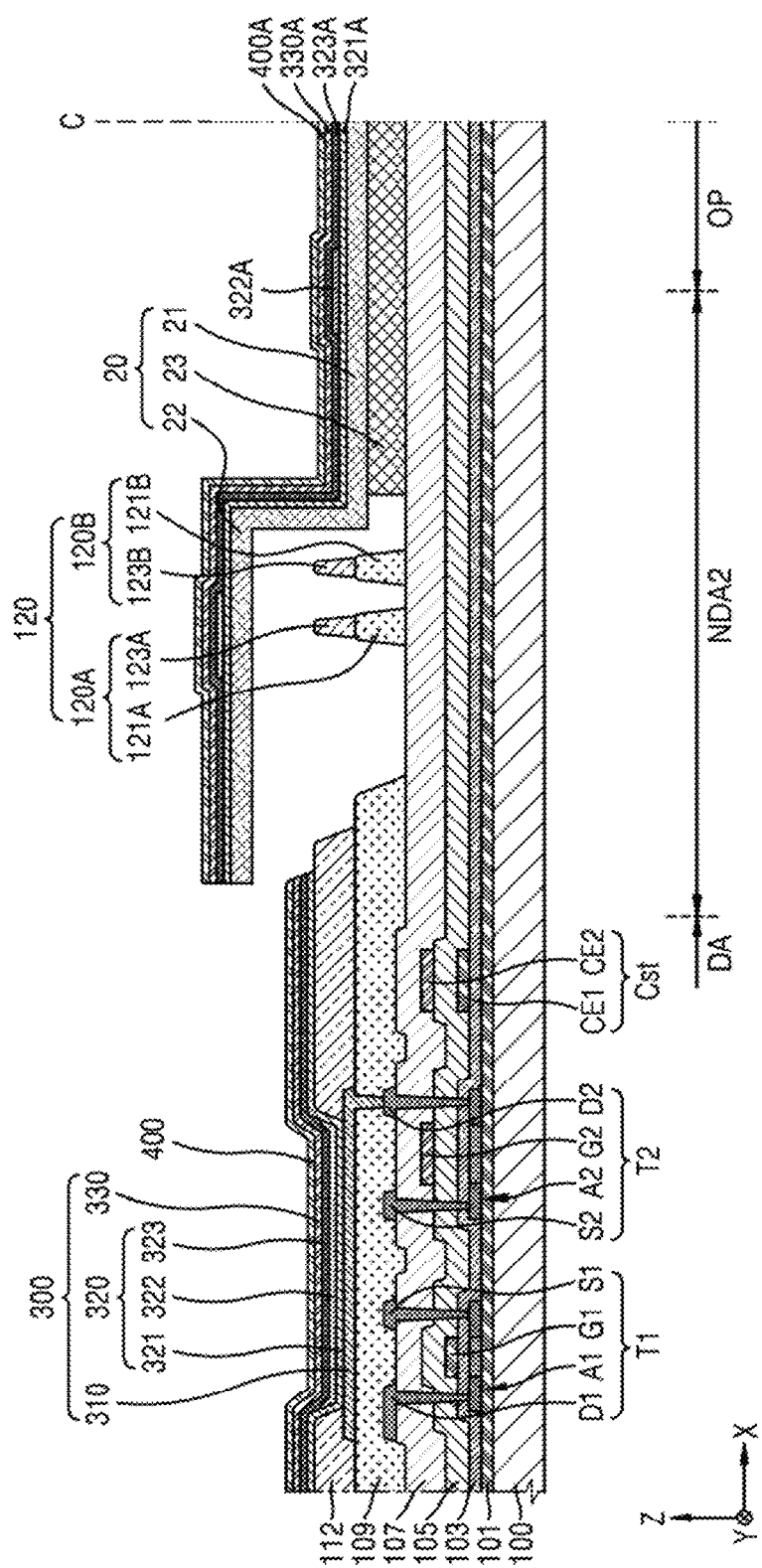
FIG. 14 is a cross-sectional view that illustrates a part of a method of manufacturing a display panel shown in FIG. 13.

FIG. 13 is a cross-sectional view of the display panel 10 according to another embodiment. FIG. 14 is a cross-sectional view that illustrates a part of a method of manufacturing the display panel 10 shown in FIG. 13. In FIGS. 13 and 14, the reference letter C denotes an imaginary straight line that passes through the center of the opening area OP, and reference numerals shown in FIGS. 13 through 14 that are same as those of FIGS. 6 and 7 denote same members as those of FIGS. 6 and 7.

Referring to FIGS. 13 and 14, according to an embodiment, the display layer 200 does not include the penetration hole 200H that corresponds to the opening area OP, and the display element layer 200A is not formed in the opening area OP. In this case, the pixel circuit layer 200B of the display layer 200 or the insulating layer of the pixel circuit layer 200B is formed in the opening area OP.

A method of manufacturing the display panel 10 according to an embodiment as described above is similar to a method described with reference to FIGS. 11 and 12. In particular, the shielding unit 20 is formed after forming the pixel electrode 310, and the first functional layer 321, the emission layer 322, the second functional layer 323, the opposite electrode 330, and the capping layer 400 are sequentially stacked on the substrate 100 and the shielding unit 20. In an embodiment, the first functional layer 321, the emission layer 322, the second functional layer 323, the opposite electrode 330, and the capping layer 400 are formed in the display area DA and on the shielding unit 20 but not in the opening area OP. In addition, the adhesion unit 23 completely shields the opening area OP and adheres the first shielding unit 21 to the insulating layer, thereby preventing the shielding unit 20 from moving. Next, the shielding unit 20 is removed and the thin film encapsulation layer 500 is formed.

Therefore, according to an embodiment, in the display panel 10, separation between the layers when forming the holes can be minimized by not forming extra holes in the opening area OP. In addition, the opening area of the display panel 10 has an increased light transmissivity since at least one of the first functional layer 321, the emission layer 322, the second functional layer 323, the opposite electrode 330, and the capping layer 400 does not extend into the opening area OP.

The display panel 10 according to an embodiment, can be manufactured quickly in an above-described method, and the manufactured display panel 10 has a high light transmissivity in the opening area OP.

Figure 15:
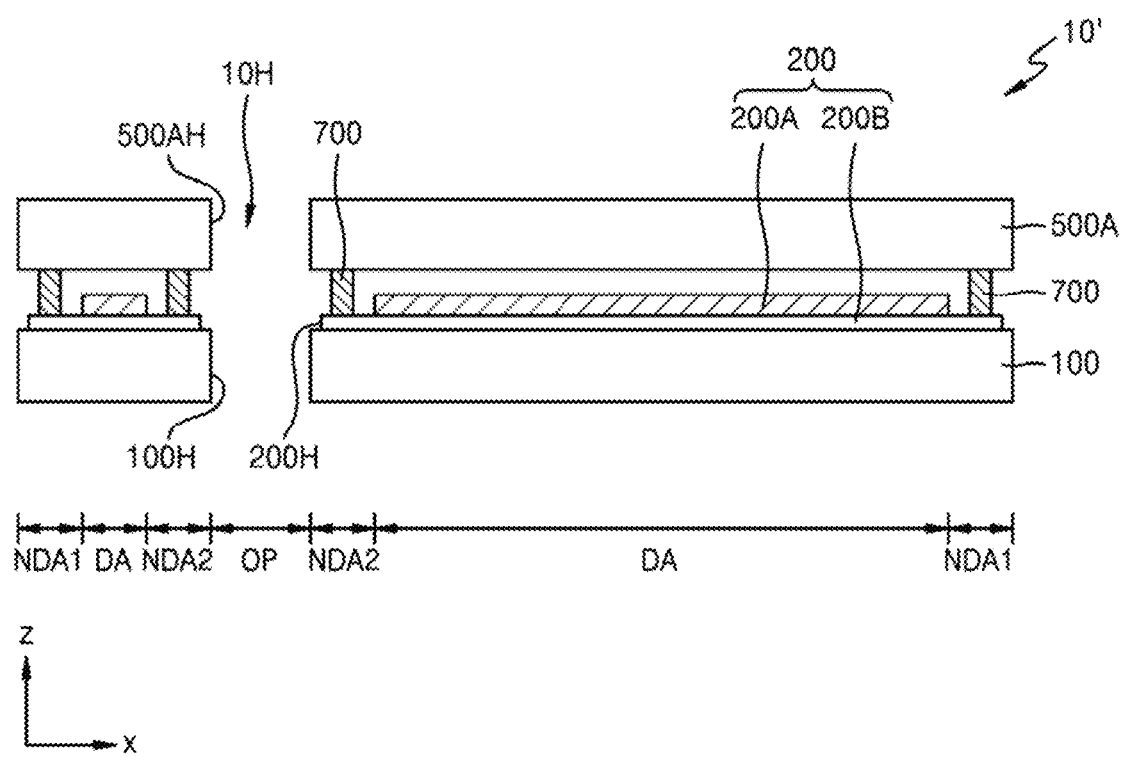
FIG. 15 is a cross-sectional view of a display panel according to another embodiment.
Figure 16:
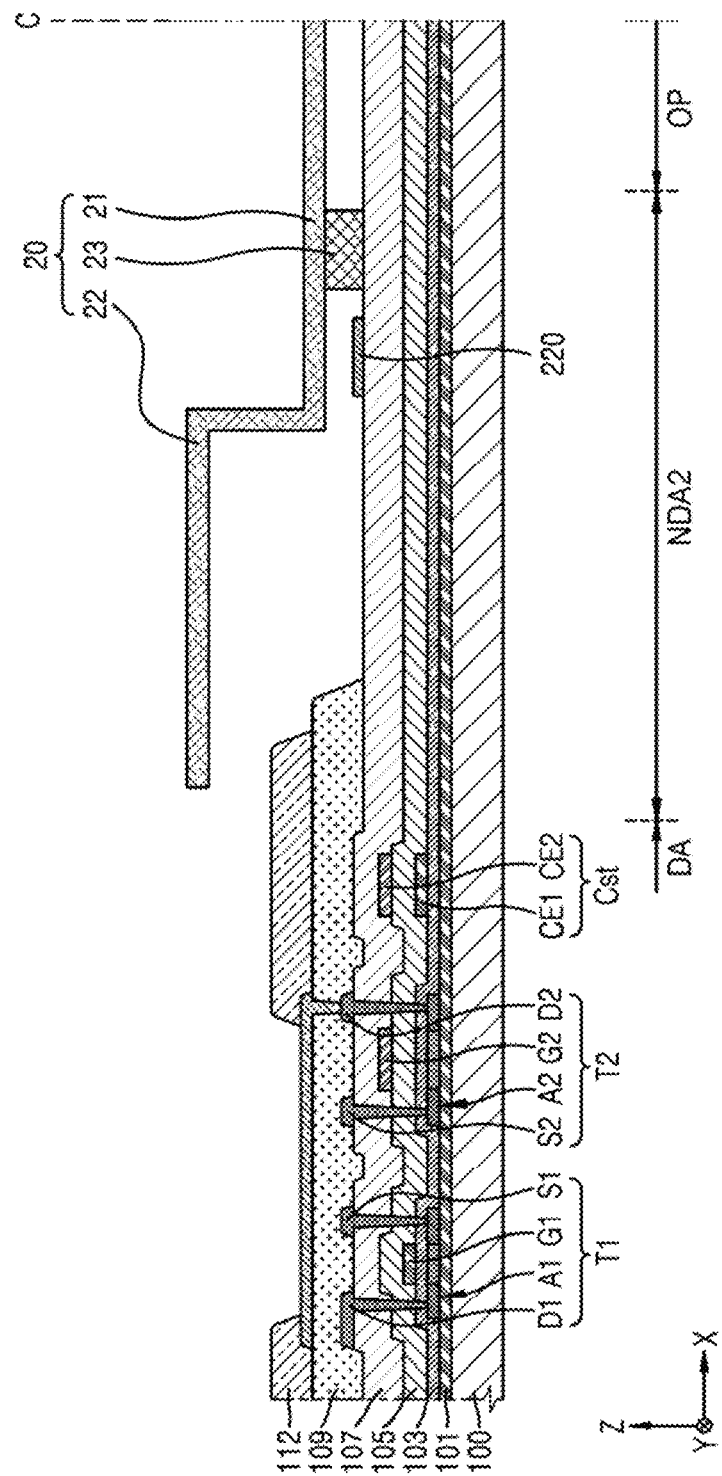
FIGS. 16 through 22 are cross-sectional views that illustrate a method of manufacturing a display panel shown in FIG. 15.

FIG. 15 is a cross-sectional view of a display panel 10' according to another embodiment. In FIG. 15, the reference letter C denotes an imaginary straight line that passes through the center of the opening area OP, and reference numerals shown in FIG. 15 that are same as those of FIGS. 6 and 7 denote same members as those of FIGS. 6 and 7.

Referring to FIG. 15, according to an embodiment, unlike the display panel 10 described above that includes the thin film encapsulation layer 500, the display panel 10' to be described below includes an encapsulation substrate 500A and a sealing unit 700.

According to an embodiment, one or more of the substrate 100, the display layer 200, and the encapsulation substrate 500A includes penetration holes 100H, 200H, and 500AH, each corresponding to the opening area OP. The display layer 200 is not formed in the opening area OP.

According to an embodiment, the substrate 100 includes glass or a polymer resin.

The polymer resin includes one of polyether sulfone, polyacrylate, polyarylate, polyetherimide, polyethylene naphthalate, polyethylene terephthalate, polyphenylene sulfide, polyimide, polycarbonate, cellulose triacetate, or cellulose acetate propionate, etc. The substrate 100 has a multi-layer structure that includes the polymer resin described above and an inorganic layer. Hereinafter, for convenience of explanation, an embodiment in which the substrate 100 includes glass will be described in detail.

According to an embodiment, the sealing unit 700 is formed between the substrate 100 and the encapsulation substrate 500A. In an embodiment, sealing unit 700 is not formed over the opening area OP. However, embodiments of the sealing unit are not limited thereto, and in another embodiment, the sealing unit 700 is formed in the opening area OP and the second non-display area NDA2. In this case, the sealing unit 700 completely covers the opening area OP in a plan view (SAR of FIG. 4).

According to an embodiment, the encapsulation substrate 500A is disposed opposite to the substrate 100. In an embodiment, the encapsulation substrate 500A includes a material that is identical or similar to that of the substrate 100. In particular, the encapsulation substrate 500A includes glass. In another embodiment, the encapsulation substrate 500A includes plastic. In this case, the encapsulation substrate 500A includes at least one layer that includes at least one resin.

In an above-mentioned embodiment, the sealing unit 700 firmly combines the substrate 100 with the encapsulation substrate 500A.

FIGS. 16 through 22 are cross-sectional views that illustrate a method of manufacturing the display panel 10' shown in FIG. 15. In FIGS. 16 through 22, the reference letter C denotes an imaginary straight line that passes through the center of the opening area OP, and those reference numerals shown in FIGS. 16 through 22 that are the same as those of FIGS. 6 and 7 denote the same members as those of FIGS. 6 and 7.

Referring to FIGS. 16 through 22, according to an embodiment, after forming the pixel electrode 310 on the substrate 100, the shielding unit 20 is formed that corresponds to the opening area OP and the second non-display area NDA2. In this case, the insulating layer described above may be or may not be formed in the opening area OP. Hereinafter, for convenience of explanation, an embodiment in which no insulating layer is formed in the opening area OP will be described in detail.

According to an embodiment, a dummy wire 220 is formed in the first non-display area NDA1 and the second non-display area NDA2 when manufacturing the source electrodes S1 and S2 and the drain electrodes D1 and D2. In particular, the dummy wire 220 is formed in a portion of the substrate 100 in which the sealing unit 700 is to be formed.

According to an embodiment, the adhesion unit 23 is formed outside of the dummy wire 220. For example, the adhesion unit 23 is formed closer in the X direction to the line C than the dummy wire 220 to shield the opening area OP. In this case, the adhesion unit 23 has the form of a ring, or a plurality of bumps spaced apart from each other. In another embodiment, the adhesion unit has the form of a plate or planar film. In another embodiment, the adhesion unit 23 is formed between the dummy wire 220 and the OLED 300. In this case, the adhesion unit 23 has the form of a ring or bumps spaced apart from each other as described above. Hereinafter, for convenience of explanation, an embodiment in which the adhesion unit 23 is formed outside of the dummy wire 220 will be described in detail.

Figure 17:
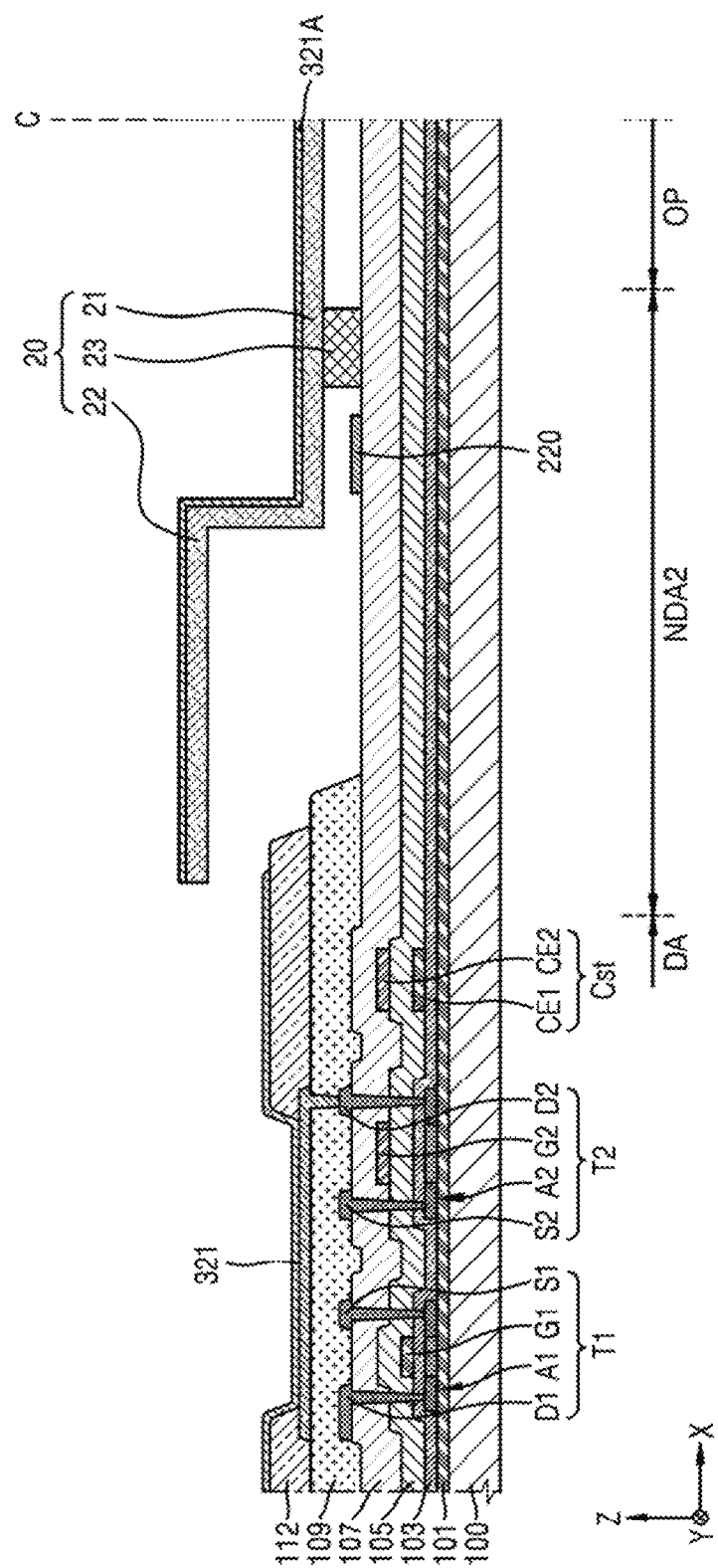

Referring now to FIG. 17, according to an embodiment, when the shielding unit 20 is formed, the first functional layer 321 is formed on the substrate 100 and the shielding unit 20. In this case, a thickness of an end portion 321-1 of the first functional layer 321 decreases toward the dummy wire 220.

Figure 18:
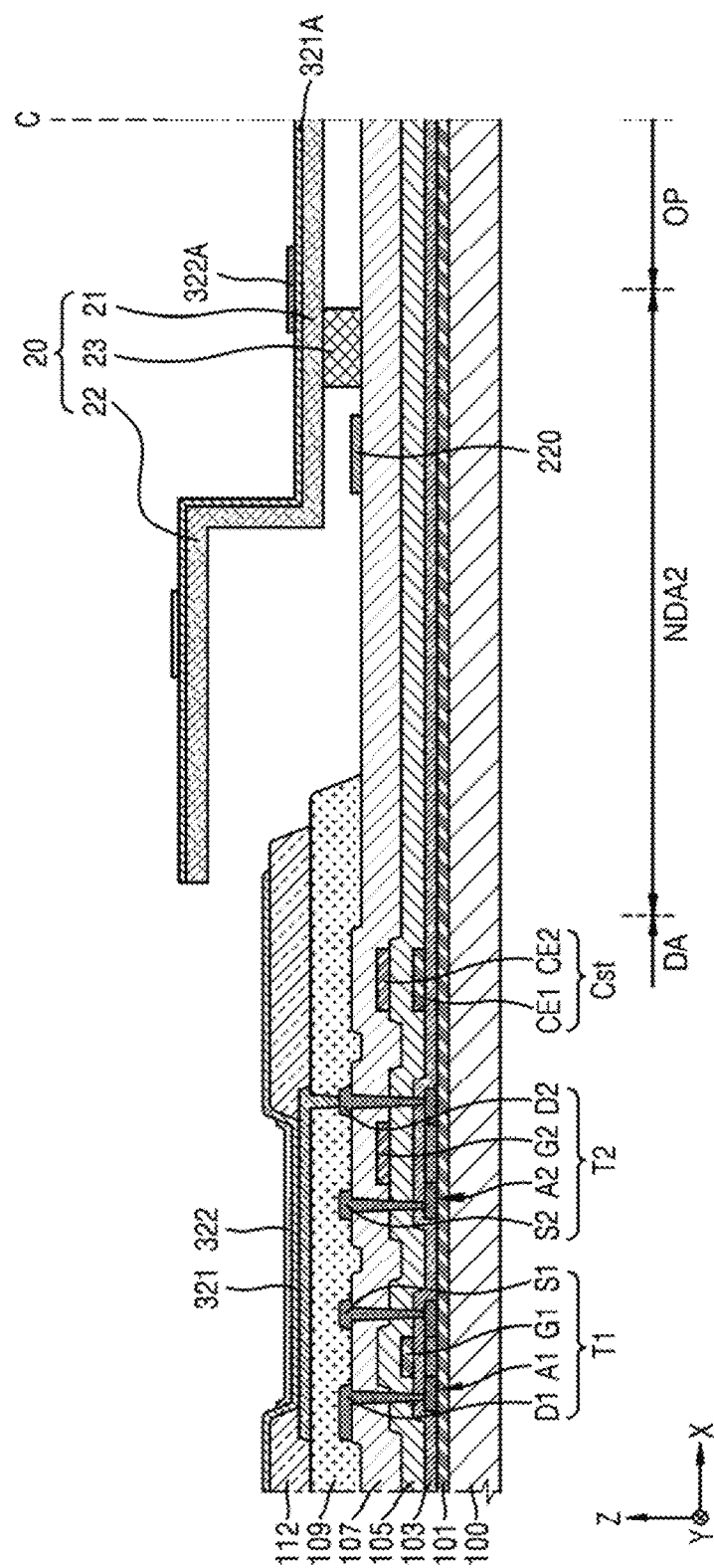

Referring now to FIG. 18, according to an embodiment, a plurality of emission layers 322 are patterned and formed spaced apart from each other on the first functional layer 321. In this case, a portion of the emission layers 322 are formed in the display area DA and another portion of the emission layers 322 are formed in the shielding unit 20.

Figure 19:
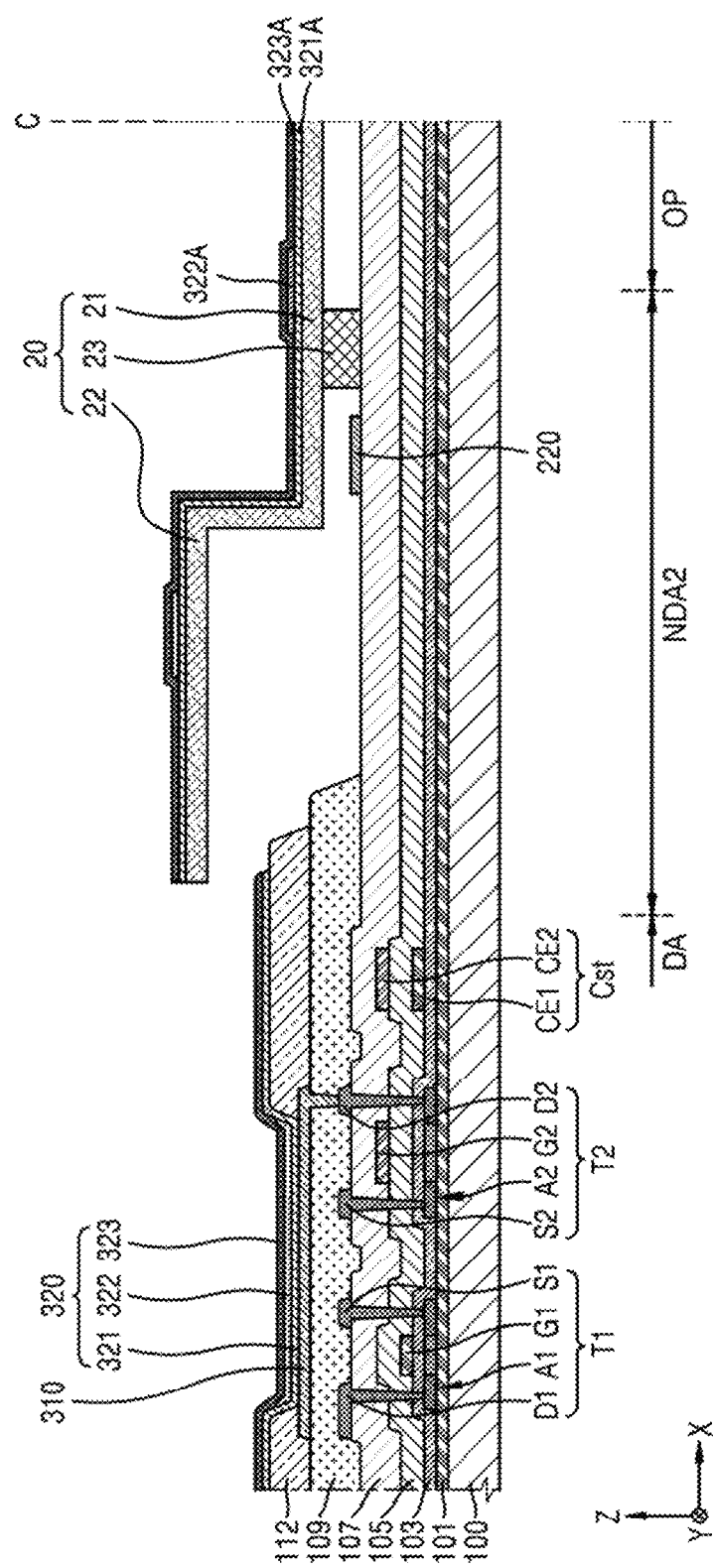

Referring now to FIG. 19, according to an embodiment, like the first functional layer 321, the second functional layer 323 is formed in the opening area OP and in the entire portion of the display area DA. In this case, the second functional layer 323 shields the emission layer 322. In addition, the second functional layer 323 is not formed in the opening area OP and at least a portion of the second non-display area of the substrate 100 due to the shielding unit 20.

Figure 20:
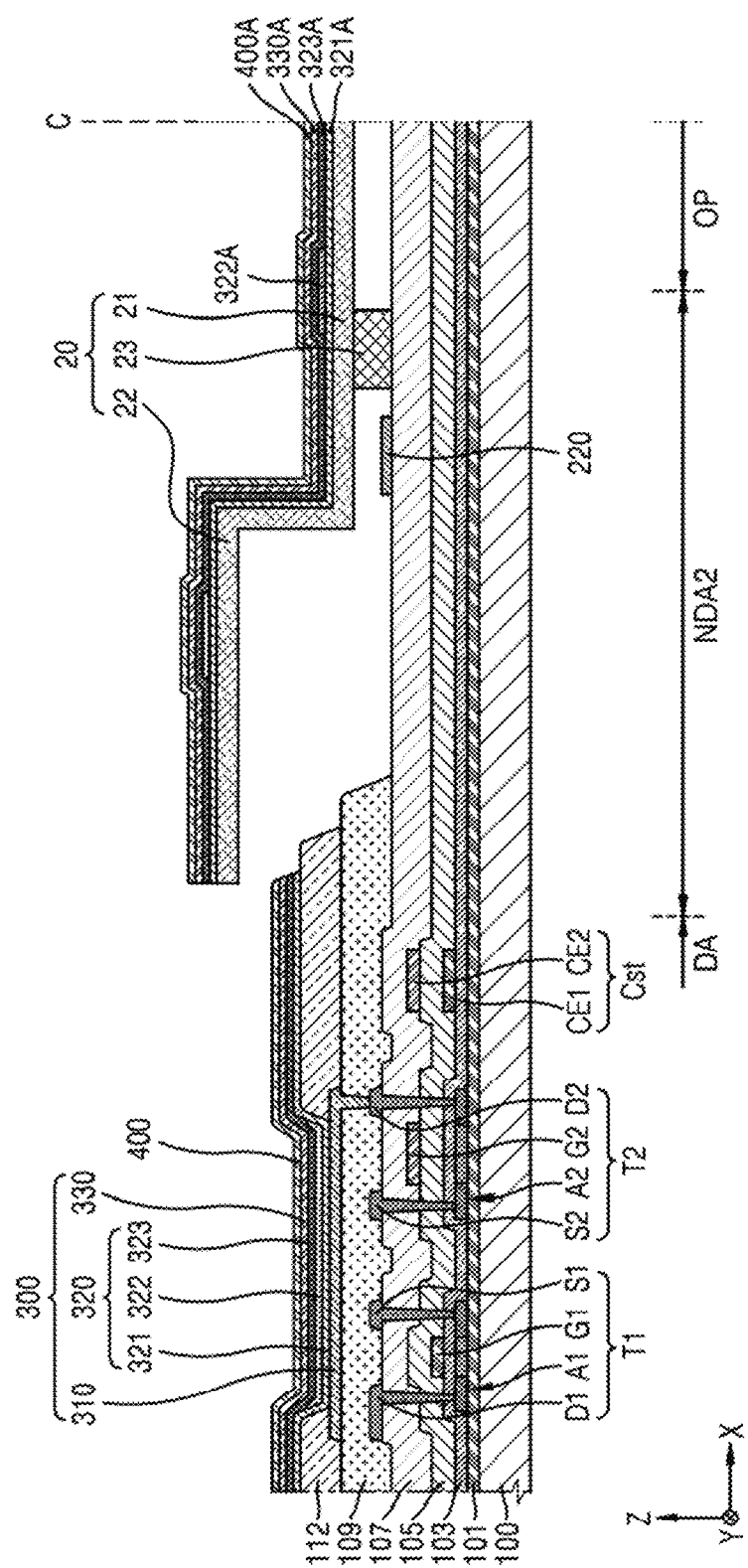

Referring now to FIG. 20, according to an embodiment, after forming the second functional layer 323, the opposite electrode 330 and the capping layer 400 are sequentially formed on the second functional layer 323.

In an above-described embodiment, similar to the thickness of the end portion 321-1 of the first functional layer 321, thicknesses of end portions of the first functional layer 321, the emission layer 322, the second functional layer 323, the opposite electrode 330, and the capping layer 400 decrease toward the dummy wire 220.

According to an embodiment, shielding unit 20 is removed after the first functional layer 321, the emission layer 322, the second functional layer 323, the opposite electrode 330, and the capping layer 400 are formed as described above. In this case, a portion of the adhesion unit 23 remains in the opening area OP.

Figure 21:
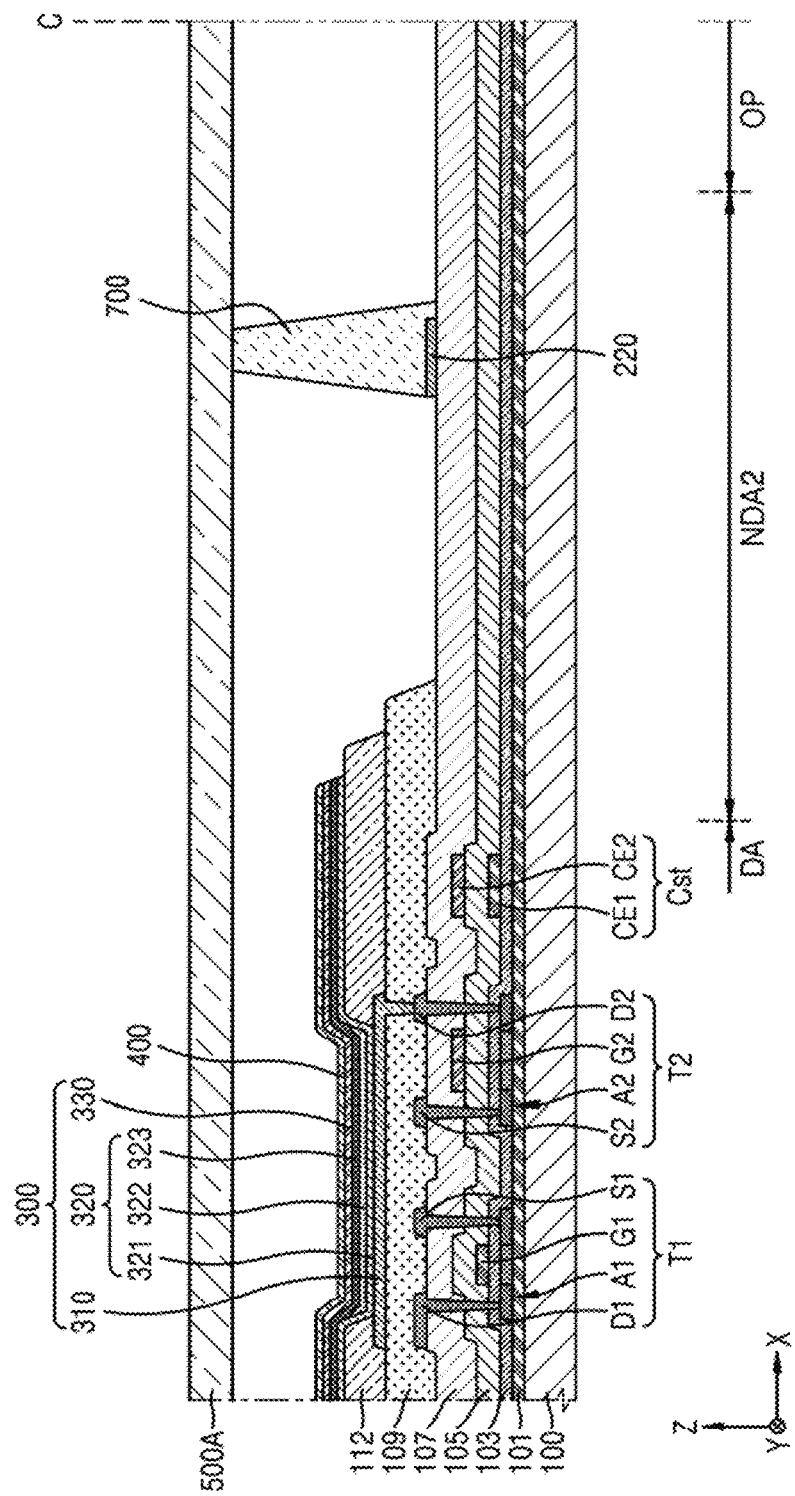
Figure 22:
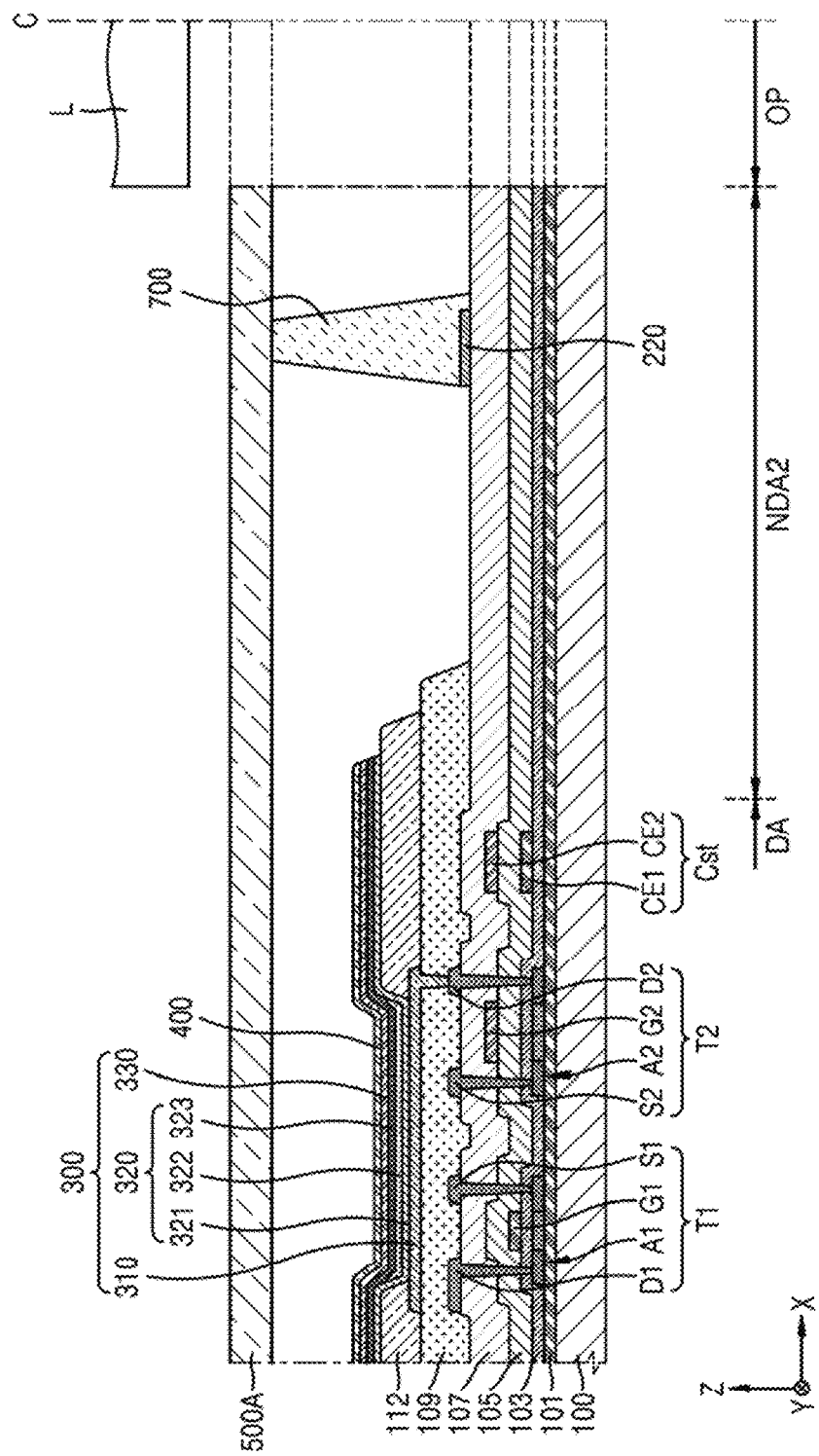

Referring now to FIG. 21, according to an embodiment, after removing the shielding unit 20, the sealing unit 700 is formed on the dummy wire 220. Next, the encapsulation substrate 500A is formed opposite to the substrate 100 and a voltage is applied to the dummy wire 220, and the encapsulation substrate 500A and the substrate 100 are combined with each other by the sealing unit 700. Embodiments of the sealing unit 700 are not limited thereto, and when no dummy wire 220 is provided, the sealing unit 700 is cured by a laser or external light. Next, as shown in FIG. 22, portions of the encapsulation substrate 500A and the substrate 100 that correspond to the opening area OP are removed by using the removing unit L.

Figure 23:
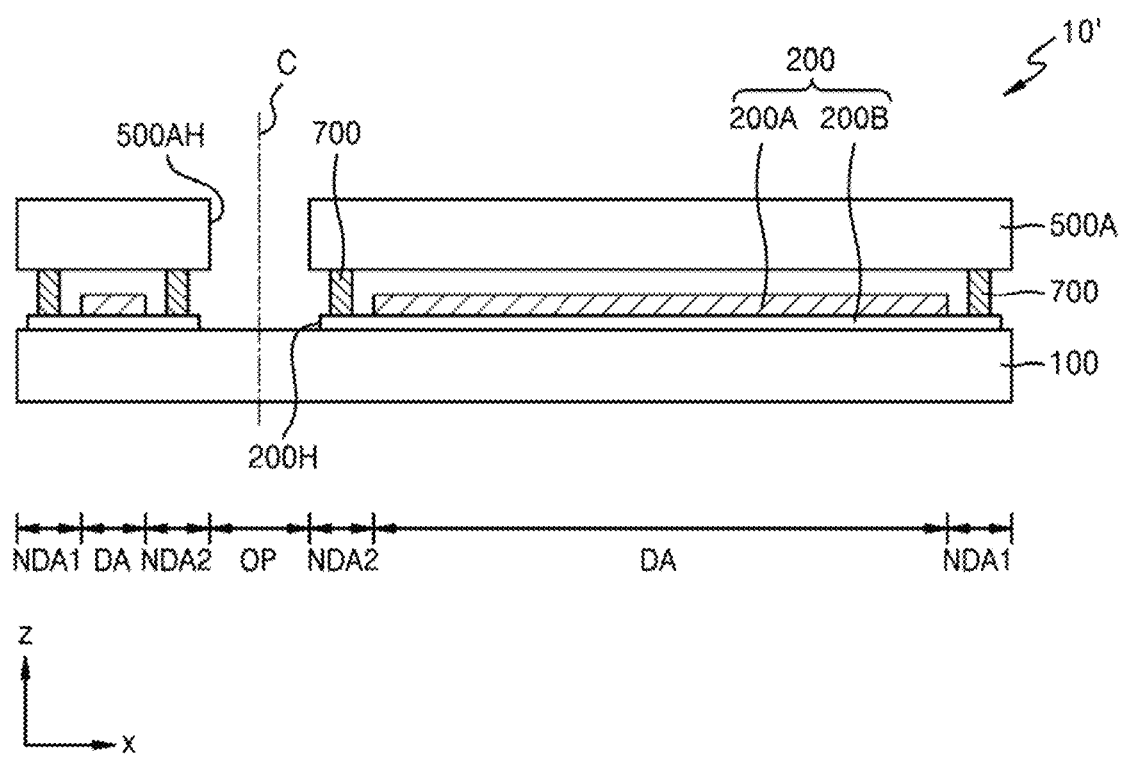
FIG. 23 is a cross-sectional view of a display panel according to another embodiment.

FIG. 23 is a cross-sectional view of the display panel 10' according to another embodiment. In FIG. 23, the reference letter C denotes an imaginary straight line that passes through the center of the opening area OP, and those reference numerals shown in FIG. 23 that are the same as those of FIGS. 6 and 7 denote the same members as those of FIGS. 6 and 7.

Referring to FIG. 23, according to an embodiment, in the display panel 10', the penetration hole 500AH is be formed in the encapsulation substrate 500A. In addition, the display element layer 200A and the pixel circuit layer 200B are not formed in the opening area OP.

According to an embodiment, the display panel 10' that is described above can be manufactured similar to a display panel shown in FIGS. 16 through 21. In this case, the penetration hole 500AH of the encapsulation substrate 500A is formed by using the removing unit.

Figure 24:
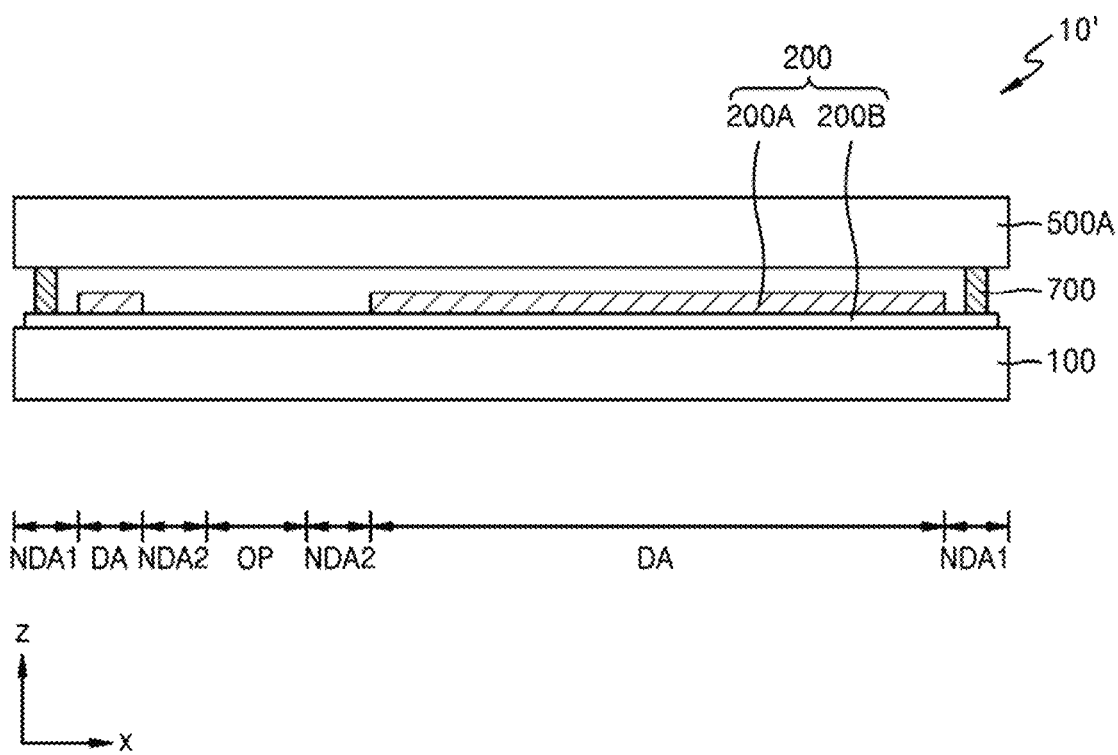
FIG. 24 is a cross-sectional view of a display panel according to another embodiment.

FIG. 24 is a cross-sectional view of the display panel 10' according to another embodiment. In FIG. 24, the reference letter C denotes an imaginary straight line that passes through the center of the opening area OP, and those reference numerals shown in FIG. 24 that are the same as those of FIGS. 6 and 7 denote the same members as those of FIGS. 6 and 7.

Referring to FIG. 24, according to an embodiment, in the display panel 10', no penetration hole is formed in the opening area OP. In this case, the pixel circuit layer 200B is formed in the opening area OP although the display element layer 200A is not formed in the opening area OP. In addition, the sealing unit 700 is formed in the first non-display area NDA1.

In an embodiment, the display panel 10' can be manufactured similar to a display panel described with reference to FIGS. 16 through 22.

Figure 25:
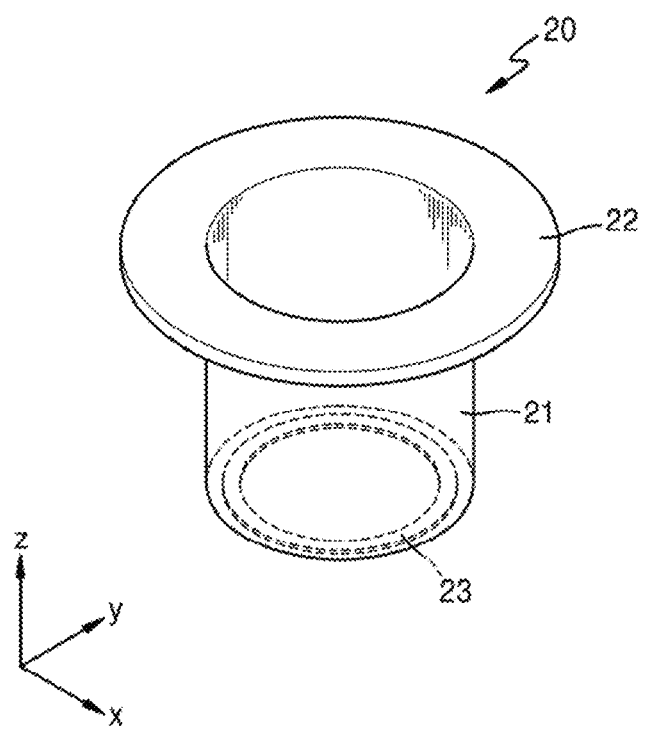
FIG. 25 is a perspective view of a shielding unit used when manufacturing a display panel according to embodiments.

FIG. 25 is a perspective view of the shielding unit 20 used when manufacturing the display panel 10 according to embodiments.

Referring to FIG. 25, according to an embodiment, the shielding unit 20 includes the first shielding unit 21, the second shielding unit 22, and the adhesion unit 23. In this case, the first shielding unit 21 and the second shielding unit 22 are shown as having three-dimensional shapes. For example, the first shielding unit 21 protrudes from the second shielding unit 22. In this case, an internal space is provided in the first shielding unit 21. In particular, a cross-section of the shielding unit 20, such as a cross-section in a YZ plane or a XZ plane, in a height direction, such as a Z direction shown in FIG. 25, of the shielding unit 20 has an uneven shape.

The first shielding unit 21 described above may have various shapes. For example, a cross-sectional shape of the first shielding unit 21 perpendicular to a height direction of the first shielding unit 21 may be a semicircle, a circle, an oval, a polygon, or a crescent. In this case, the cross-section of the first shielding unit 21 perpendicular to the height direction of the first shielding unit 21 corresponds to the shape of the opening area OP.

According to an embodiment, a girth of the second shielding unit 22 is greater than a girth of the first shielding unit 21. In this case, the second shielding unit 22 protrudes from the first shielding unit 21.

According to an embodiment, the adhesion unit 23 is formed in the first shielding unit 21. In this case, the adhesion unit 23 has the form of a ring, and the internal space of the first shielding unit 21 is enclosed by the adhesion unit 23 in a plan view.

In an embodiment, the opening area OP described above is formed in the internal space enclosed by the adhesion unit 23. In this case, the adhesion unit 23 is formed in the second non-display area NDA2 that is described above.

In another embodiment, the adhesion unit 23 is formed in the opening area OP. In this case, when a hole is formed in the opening area OP, portions of the adhesion unit 23 that remain in the opening area OP are removed when forming the hole in the opening area OP.

In another embodiment, the adhesion unit 23 is simultaneously formed in the opening area OP and the second non-display area NDA2. In this case, a portion of the opening area OP is formed in the internal space of the adhesion unit 23.

Figure 26:
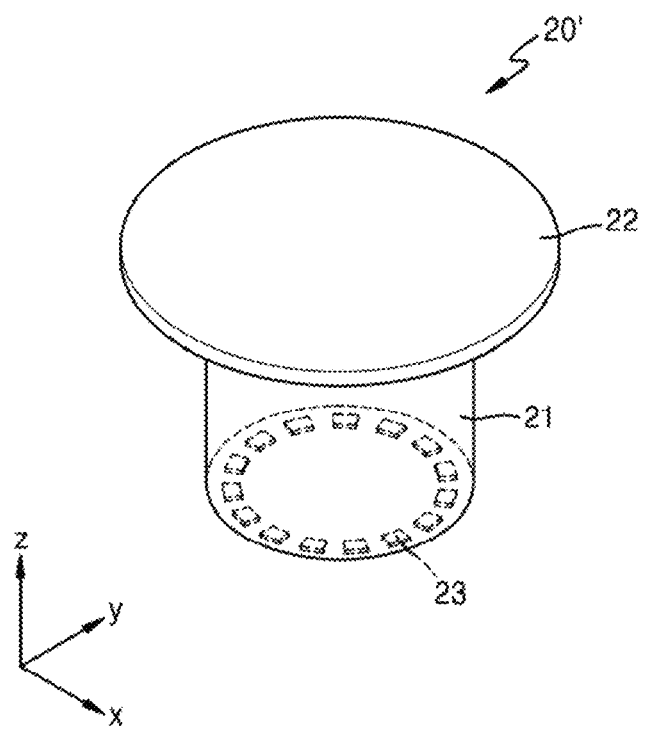
FIG. 26 is a perspective view of another shielding unit used when manufacturing a display panel according to embodiments.

FIG. 26 is a perspective view of another shielding unit 20' used when manufacturing the display panel 10' according to embodiments.

Referring to FIG. 26, according to an embodiment, the shielding unit 20' includes the first shielding unit 21, the second shielding unit 22, and the adhesion unit 23.

According to an embodiment, no space is formed in the first shielding unit 21. In this case, the first shielding unit 21 has the form of a pillar, and the second shielding unit 22 has a planar shape.

According to an embodiment, a plurality of adhesion units 23 are provided that are spaced apart from each other along a circle in the first shielding unit 21. In this case, the plurality of adhesion units 23 are arranged on a same circumference. In another embodiment, the plurality of adhesion units 23 are provided in a line from a center of the first shielding unit 21 to an outer surface of the first shielding unit 21. Embodiments of the plurality of adhesion units 23 are not limited thereto, and in other embodiments, the adhesion units 23 can be arranged to form a pattern or arranged at random on the first shielding unit 21.

According to embodiments, the plurality of adhesion units 23 are arranged at various positions.

In an embodiment, when the plurality of adhesion units 23 form an internal space, the opening area OP described above substantially corresponds to the internal space formed by the plurality of adhesion units 23. In addition, the plurality of adhesion units 23 are arranged in the second non-display area NDA2 described above.

In another embodiment, the plurality of adhesion units 23 can be spaced apart from each other in the opening area OP. In this case, when a hole is formed in the opening area OP, portions of the adhesion unit 23 remaining in the opening area OP are removed when forming the hole in the opening area OP.

In another embodiment, the plurality of adhesion units 23 are spaced apart from each other in the opening area OP and the second non-display area NDA2.

Figure 27:
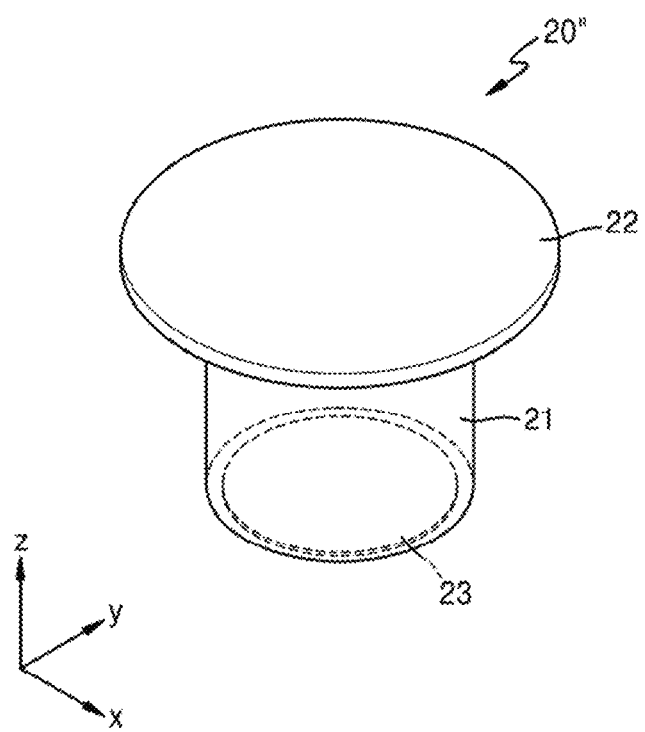
FIG. 27 is a perspective view of another shielding unit used when manufacturing a display panel according to embodiments.

FIG. 27 is a perspective view of another shielding unit 20″ used when manufacturing the display panel according to embodiments.

Referring to FIG. 27, according to an embodiment, the shielding unit 20″ includes the first shielding unit 21, the second shielding unit 22, and the adhesion unit 23.

According to an embodiment, the adhesion unit 23 is formed on a surface of the first shielding unit 21. In this case, the adhesion unit 23 is formed in a single body.

According to an embodiment, the adhesion unit 23 can be arranged at various positions.

In an embodiment, the shielding unit 23 is disposed in the opening area OP to shield the opening area OP. In this case, the adhesion unit 23 remains in the opening area OP when the shielding unit 20 is removed and is removed when the penetration hole is formed in the opening area OP.

In another embodiment, the adhesion unit 23 is also disposed in the opening area OP. In this case, when a hole is formed in the opening area OP, the adhesion unit 23 is removed.

In another embodiment, the adhesion unit 23 is formed in the opening area OP and the second non-display area NDA2. In this case, the adhesion unit 23 shields the opening area OP.

A display apparatus according to embodiments has a flat surface, and a lifetime of a display apparatus increases as permeation of oxygen and moisture is prevented.

A method of manufacturing a display apparatus according to embodiments can minimize defects in the display apparatus. In addition, a display apparatus having an increased lifetime can be manufactured by a method of manufacturing a display apparatus according to embodiments.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
   forming a pixel defining layer on a substrate, wherein the substrate includes an opening area and a non-display area that at least partially surrounds the opening area;
   forming a shielding unit that covers a portion of the pixel defining layer, the opening area and the non-display area; and
   forming an intermediate layer, an opposite electrode, and a capping layer on the pixel defining layer and the shielding unit,
   wherein an end portion of each of the intermediate layer, the opposite electrode, and the capping layer is disposed on an upper surface of the pixel defining layer and has a thickness on the upper surface of the pixel defining layer that decreases toward the opening area of the substrate,
   wherein the shielding unit comprises:
      a first shielding unit that shields the opening area and extends parallel to an uppermost surface of the pixel defining layer;
      a second shielding unit connected to the first shielding unit and extends parallel to the uppermost surface of the pixel defining layer and is spaced above the upper surface of the pixel defining layer, wherein a lower surface of the second shielding unit does not make contact with an uppermost surface of a layer stacked immediately below the second shielding unit, and
      a bent portion that connects the first shielding unit to the second shielding unit, wherein the bent portion is perpendicular to both the first shielding unit and the second shielding unit.

2. The method of claim 1, wherein the first shielding unit and the second shielding unit are respectively formed at different heights.

3. The method of claim 1, wherein the shielding unit further comprises an adhesion unit formed under the first shielding unit, wherein the adhesion unit includes a micro-sized vacuum grease or a heat resistant silicon-based adhesive.

4. The method of claim 3, wherein at least a portion of the adhesion unit is formed in the non-display area.

5. The method of claim 1, further comprising removing the shielding unit from the substrate.

6. The method of claim 1, further comprising forming an encapsulation substrate above and apart from the substrate and attaching the encapsulation substrate to the substrate.

7. The method of claim 1, further comprising forming a thin film encapsulation layer on the pixel defining layer.

8. The method of claim 1, further comprising forming a penetration hole in the substrate.

9. A method of manufacturing an electronic apparatus, the method comprising:
   forming a pixel defining layer on a substrate, wherein the substrate includes a display area, an opening area in the display area and a non-display area that at least partially surrounds the opening area; and
   attaching a shielding unit to the opening area or non-display area that shields a portion of the pixel defining layer, the opening area and the non-display area,
   wherein a portion of the shielding unit is spaced apart from the pixel defining layer,
   wherein a first portion of the shielding unit is formed at a height that differs from a height of a second portion of the shielding unit, wherein a lower surface of the second shielding unit does not make contact with an uppermost surface of a layer stacked immediately below the second shielding unit, and wherein the shielding unit includes a bent portion that connects the first portion of the shielding unit to the second portion of the shielding unit, wherein the bent portion is perpendicular to both the first shielding unit and the second shielding unit.

10. The method of claim 9, further comprising:
forming an intermediate layer, an opposite electrode, and a capping layer on the pixel defining layer and the shielding unit,
wherein an end portion of each of the intermediate layer, the opposite electrode, and the capping layer is disposed on an upper surface of the pixel defining layer and has a thickness on the upper surface of the pixel defining layer that decreases toward the opening area of the substrate.

11. The method of claim 9, wherein the shielding unit is attached to the display area or the non-display area.

12. The method of claim 9, wherein
the shielding unit is attached to the display area or the non-display area at a plurality of positions in the display area or the non-display area, wherein the plurality of positions are spaced apart from each other.

13. The method of claim 9, wherein the shielding unit is attached to the non-display area and covers the opening area.

14. The method of claim 9, further comprising removing the shielding unit from the substrate.

15. The method of claim 9, further comprising forming an encapsulation substrate over the substrate that is spaced apart from the substrate and combining the encapsulation substrate with the substrate.

16. The method of claim 9, further comprising forming a thin film encapsulation layer on the pixel defining layer.

17. The method of claim 9, further comprising forming a penetration hole in the substrate.

18. A method of manufacturing a display apparatus, the method comprising:
forming a pixel defining layer on a substrate, wherein the substrate includes an opening area and a non-display area that at least partially surrounds the opening area;
forming a shielding unit that covers a portion of the pixel defining layer, the opening area and the non-display area; and
forming an intermediate layer, an opposite electrode, and a capping layer on the pixel defining layer and the shielding unit,
wherein an end portion of each of the intermediate layer, the opposite electrode, and the capping layer is disposed on an upper surface of the pixel defining layer and has a thickness on the upper surface of the pixel defining layer that decreases toward the opening area of the substrate,
wherein the shielding unit comprises:
a first shielding unit that shields the opening area and extends parallel to an uppermost surface of the pixel defining layer;
a second shielding unit connected to the first shielding unit and extends parallel to the uppermost surface of the pixel defining layer and is spaced above the upper surface of the pixel defining layer, wherein a lower surface of the second shielding unit does not make contact with an uppermost surface of a layer stacked immediately below the second shielding unit or with a top of a pair of partitions that protrude upward from the non-display area of the substrate, and
a bent portion that connects the first shielding unit to the second shielding unit, wherein the bent portion is connected to an end of the first shielding unit and an end of the second shielding unit so that the first shielding unit is spaced apart from the second shielding unit.

* * * * *